(12) United States Patent
Fukae

(10) Patent No.: US 12,362,096 B2
(45) Date of Patent: Jul. 15, 2025

(54) CHIP PARTS

(71) Applicant: ROHM CO., LTD., Kyoto (JP)

(72) Inventor: Keisuke Fukae, Kyoto (JP)

(73) Assignee: ROHM CO., LTD., Kyoto (JP)

(*) Notice: Subject to any disclaimer, the term of this patent is extended or adjusted under 35 U.S.C. 154(b) by 110 days.

(21) Appl. No.: 17/948,860

(22) Filed: Sep. 20, 2022

(65) Prior Publication Data

US 2023/0098377 A1     Mar. 30, 2023

(30) Foreign Application Priority Data

Sep. 29, 2021   (JP) ................................ 2021-160041

(51) Int. Cl.
| | |
|---|---|
| *H01G 4/008* | (2006.01) |
| *H01G 4/224* | (2006.01) |
| *H01G 4/232* | (2006.01) |
| *H01G 4/30* | (2006.01) |
| *H10D 1/68* | (2025.01) |

(52) U.S. Cl.
CPC ............ *H01G 4/008* (2013.01); *H01G 4/224* (2013.01); *H01G 4/232* (2013.01); *H01G 4/30* (2013.01); *H10D 1/692* (2025.01)

(58) Field of Classification Search
CPC ........ H01G 4/008; H01G 4/224; H01G 4/232; H01G 4/30; H01L 28/60
See application file for complete search history.

(56) References Cited

U.S. PATENT DOCUMENTS

| | | | |
|---|---|---|---|
| 2002/0003305 A1* | 1/2002 | Umakoshi ......... | H01L 23/53295 257/E27.088 |
| 2002/0102804 A1* | 8/2002 | Nagase ............... | H01L 27/0676 257/E27.024 |
| 2004/0095710 A1* | 5/2004 | Miki ........................ | H01G 4/40 257/E23.079 |
| 2007/0205486 A1* | 9/2007 | Shioga .................... | H01L 28/65 257/E23.079 |
| 2010/0066479 A1* | 3/2010 | Tanaka ................... | H01C 7/102 338/20 |
| 2013/0241078 A1* | 9/2013 | Lee ........................ | H01L 23/481 257/774 |

(Continued)

FOREIGN PATENT DOCUMENTS

| | | |
|---|---|---|
| JP | S5124768 A | 2/1976 |
| JP | S63312613 A | 12/1988 |

(Continued)

OTHER PUBLICATIONS

Notice of Reasons for Refusal with Search report issued May 29, 2025, in corresponding Japanese patent application No. 2021-160041 (65 pages; with English machine translation).

*Primary Examiner* — Michael P McFadden
(74) *Attorney, Agent, or Firm* — Rabin & Berdo, P.C.

(57) ABSTRACT

The present disclosure provides a chip part. The chip part includes: a substrate, having a first main surface and a second main surface opposite to the first main surface; a capacitive film, disposed on the first main surface; a plurality of first external electrodes, disposed on the capacitive film and separated from each other; a second external electrode, disposed on the second main surface; a resistance layer, disposed between the capacitive film and the plurality of first external electrodes, and formed across the plurality of first external electrodes.

19 Claims, 26 Drawing Sheets

(56) References Cited

U.S. PATENT DOCUMENTS

| | | | | |
|---|---|---|---|---|
| 2015/0001579 A1* | 1/2015 | Nishimura | ............ | H01L 29/7803 |
| | | | | 438/237 |
| 2015/0249055 A1* | 9/2015 | Yamamoto | ............ | H01L 29/866 |
| | | | | 257/476 |
| 2016/0164461 A1* | 6/2016 | Ozawa | .................. | H05K 1/181 |
| | | | | 331/116 R |
| 2018/0240599 A1* | 8/2018 | Tsunoda | .................. | H01G 9/04 |

FOREIGN PATENT DOCUMENTS

| | | |
|---|---|---|
| JP | H11297568 A | 10/1999 |
| JP | 2017-195322 A | 10/2017 |

\* cited by examiner

CHIP PARTS

TECHNICAL FIELD

The present disclosure relates chip parts.

BACKGROUND

Patent document 1 discloses a chip capacitor including a substrate, a first conductive film and a first pad film formed on the substrate, a dielectric layer formed on the first conductive film and the first pad film, and a second conductive film formed on the dielectric film and including a second connection region and a second capacitor forming region. The first conductive film includes a first connection region and a first capacitor forming region. A first external electrode is bonded to the first connection region of the first conductive film, and a second external electrode is bonded to the second connection region of the second conductive film.

PRIOR ART DOCUMENT

[Patent Publication]
[Patent document 1] Japan Patent Publication No. 2017-195322

SUMMARY

Problems to be Solved by the Disclosure

A chip part is provided according to an embodiment of the present disclosure. The chip part is capable of efficiently utilizing the space of a first main surface of a semiconductor substrate and includes a small-size composite element (a capacitor and a resistance element).
[Technical Means for Solving the Problem]
A chip part according to an embodiment of the present disclosure includes: a semiconductor substrate, having a first main surface and a second main surface opposite to the first main surface; a capacitive film, disposed on the first main surface; a plurality of first electrodes, disposed on the capacitive film and separated from each other; a second electrode, disposed on the second main surface; a resistance layer, disposed between the capacitive film and the plurality of first electrodes, and formed across the plurality of first electrodes.
[Effects of the Disclosure]
In the chip part according to an embodiment of the present disclosure, the first electrodes are opposite to the semiconductor substrate (the second electrode) interposed by the capacitive film in between. Accordingly, a vertical capacitor having a laminated structure of an upper electrode-capacitive film-lower electrode is formed in the longitudinal direction along the thickness direction of the semiconductor substrate. On the other hand, the first electrodes include a plurality of first electrodes separated from each other, and the resistance layer crosses the plurality of first electrodes. Thus, the resistance layer is connected in series among the plurality of first electrodes to form a horizontal resistance element in which a current flows in the lateral direction of the first main surface of the semiconductor substrate. That is to say, the chip part according to an embodiment of the present disclosure is a composite element in which the vertical capacitor and the horizontal resistance element are formed on the common semiconductor substrate (the vertical capacitor and the horizontal resistance element are integrated on one semiconductor substrate). Because the first electrodes of the vertical capacitor serve as a terminal of the horizontal resistance element, a region for the capacitor and a region for the resistance element can be formed in an overlapping manner on the first main surface of the semiconductor substrate. Thus, the space of the first main surface of the semiconductor substrate can be efficiently utilized, thereby providing the chip part including a small-size composite element.

DETAILED DESCRIPTION OF THE EMBODIMENTS

Figure 1:
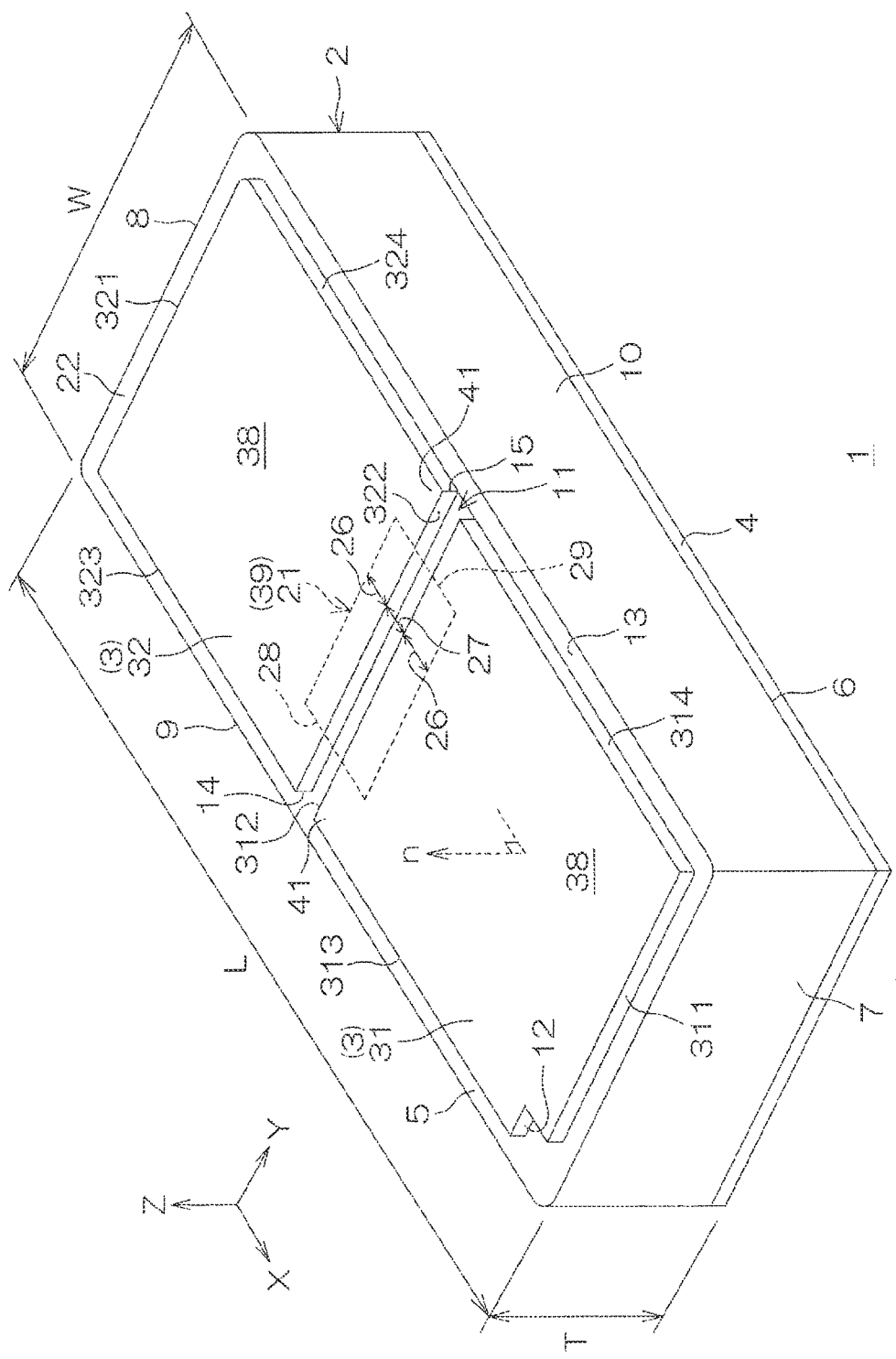
FIG. 1 is a perspective schematic diagram of a chip part according to an embodiment of the present disclosure.
Figure 2:
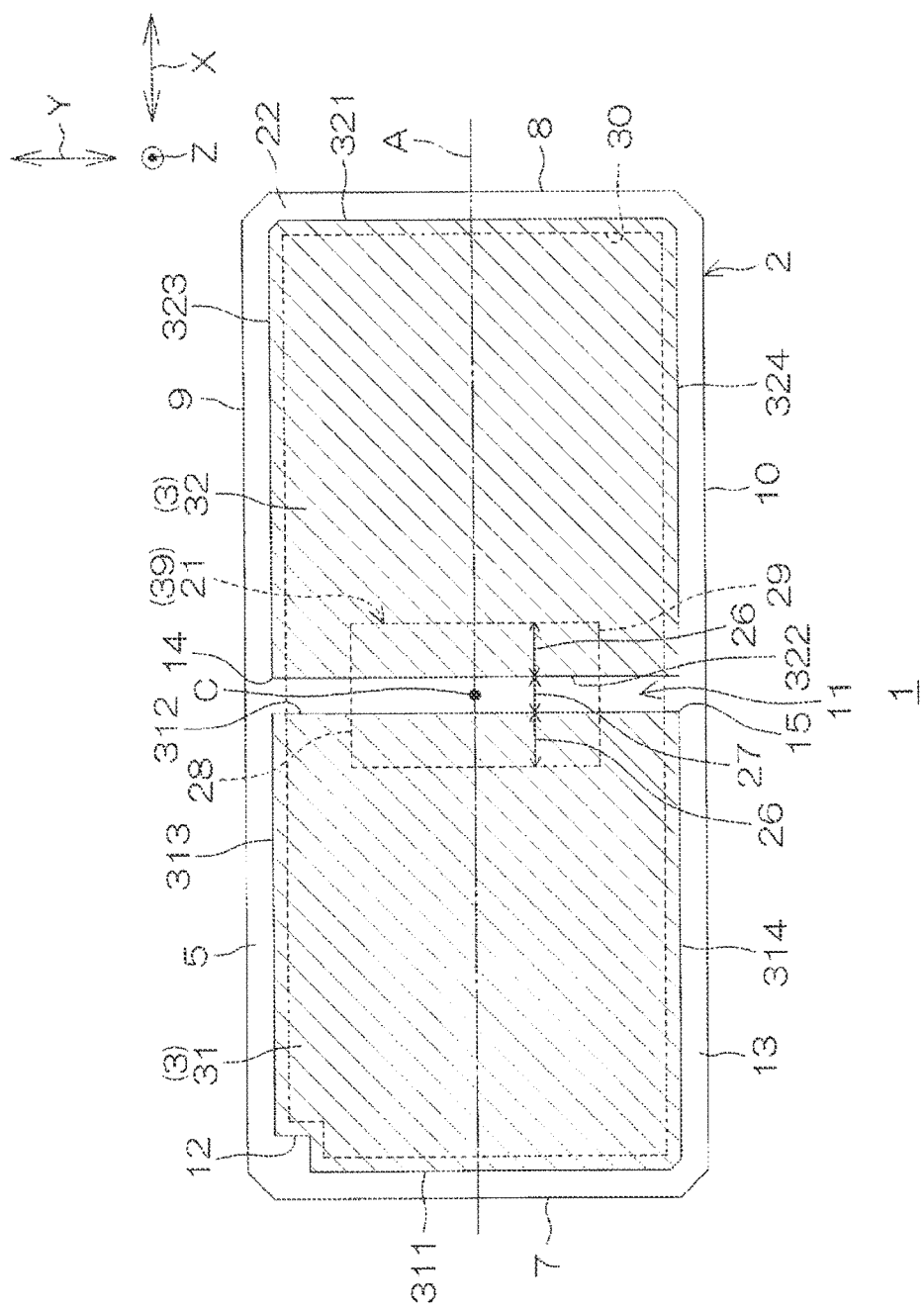
FIG. 2 is a schematic top view of the chip part.
Figure 3:
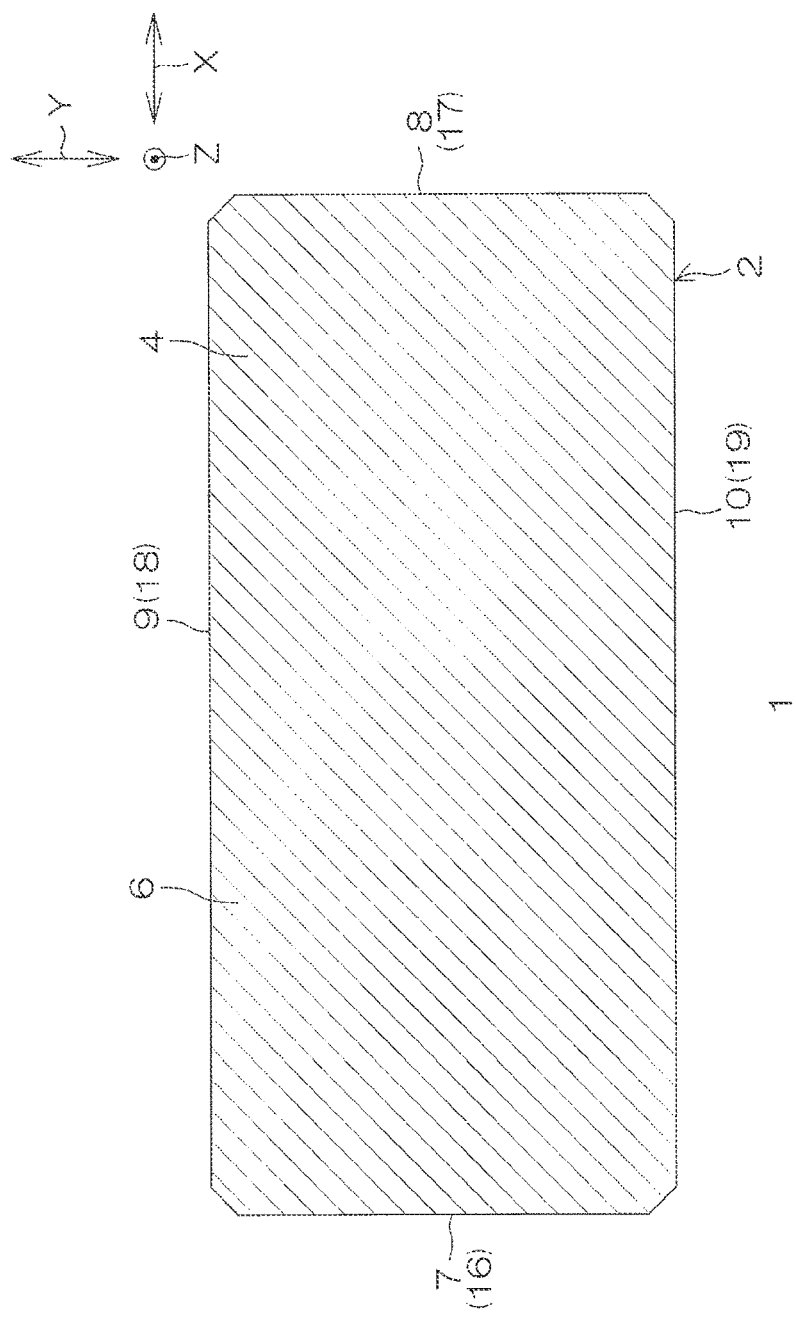
FIG. 3 is a schematic bottom view of the chip part.

Details of the embodiments of the present disclosure are given with the accompanying drawings below.
[Appearance of Chip Part 1]
FIG. 1 shows a perspective schematic diagram of a chip part 1 according to an embodiment of the present disclosure. FIG. 2 shows a schematic top view of the chip part 1. FIG. 3 shows a schematic bottom view of the chip part 1. In FIG. 1 to FIG. 3, the longitudinal direction of the chip part 1 having a cuboid shape is defined as a first direction X, the lateral direction of the chip part 1 is defined as a second direction Y, and a thickness direction of the chip part 1 is defined as a third direction Z. Moreover, in FIG. 2 and FIG. 3, for clarity, a first external electrode 3 and a second external electrode 4 are shaded by lines.

The chip part 1 is formed in a cuboid shape, and has a length L in the first direction X, a width W in the second direction Y and a thickness T in the third direction Z. The length L may be, for example, between 0.4 millimeters (mm) and 2 mm. The width W may be, for example, between 0.2 mm and 2 mm. The thickness T may be, for example, between 0.1 mm and 0.5 mm.

The chip part 1 may also be a small-size electronic component using a chip designation (length L (mm)×width W (mm)), for example, referred to as a 1608 (1.6 mm×0.8 mm) chip, a 1005 (1.0 mm×0.5 mm) chip, 0603 (0.6 mm×0.3 mm) chip, 0402 (0.4 mm×0.2 mm) chip, or 03015 (0.3 mm×0.15 mm) chip.

The chip part 1 includes a substrate 2, a first external electrode 3 and a second external electrode 4.

The substrate 2 forms a base substrate of the chip part 1. The chip part 1 is formed by supporting a plurality of insulating films and metal films laminated on each other on the substrate 2. The substrate 2 exhibits a cuboid shape having substantially the same dimensions as the chip part 1. In this embodiment, the substrate 2 may also be a semiconductor substrate such as a silicon substrate. The thickness of the substrate 2 may be, for example, between 200 micrometers (μm) and 600 μm.

The substrate 2 has a first main surface 5, a second main surface 6 and four side surfaces 7 to 10. The first main surface 5 is the so-called front side of the chip part 1, and the second main surface 6 is the obverse side of the chip part 1. The four side surfaces 7 to 10 surround the first main surface 5 when observed in a plan view and along a normal direction n of the first main surface 5 (to be referred to as the plan view). The four side surfaces 7 to 10 may also include a pair of a first side surface 7 and a second side surface 8 opposite to each other in the first direction X, and a pair of a third side surface 9 and a fourth side surface 10 opposite to each other in the second direction Y. In other words, the side surfaces extending in parallel to each other in the second direction Y may be the first side surface 7 and the second side surface 8 on the lateral side of the substrate 2, and the side surfaces extending in parallel to each other in the first direction X may be the third side surface 9 and the fourth side surface 10 on the longitudinal side of the substrate 2. The first side surface 7, the second side surface 8, the third side surface 9 and the fourth side surface 10 may also be referred to as a first end surface, a second end surface, a third end surface and a fourth end surface, respectively.

The first external electrode 3 is disposed on the first main surface 5. The first external electrode 3 may also by physically separated into a plurality of electrodes. In this embodiment, the first external electrode 3 includes one 1-1 external electrode 31 and one 1-2 external electrode 32. The first external electrode 3 may also referred as including a pair of electrodes 31 and 32 that are physically separated.

The 1-1 external electrode 31 and the 1-2 external electrode 32 are divided along the lateral direction (the second direction Y in this embodiment) of the substrate 2 and arranged in a row along the longitudinal direction (the first direction X in this embodiment) of the substrate 2 in the plan view. More specifically, the 1-1 external electrode 31 and the 1-2 external electrode 32 are separated by a linear gap 11 extending in the second direction Y from the third side surface 9 toward the fourth side surface 10 in a center of the substrate 2 in the first direction X.

The 1-1 external electrode 31 forms a quadrilateral shape have dimensions substantially that same as those of the 1-2 external electrode 32. The four side surfaces 311 to 314 of the 1-1 external electrode 31 may include a pair of a first side surface 311 and a second side surface 312 opposite to each other in the first direction X, and a pair of a third side surface 313 and a fourth side surface 314 opposite to each other in the second direction Y. The 1-1 external electrode 31 is disposed to have the side surfaces 311 to 314 of the 1-1 external electrode 31 be respectively parallel to the side surfaces 7 to 10 of the substrate 2. The 1-1 external electrode 31 covers substantially an entirety of a half of the first main surface 5 on the side of the first side surface 7 with respect to the gap 11.

A notch 12 is formed on a peripheral edge of the 1-1 external electrode 3. The notch 12 may also function as a label for determining the direction of the chip part 1 when the chip part 1 is mounted on the substrate, for example. A notch similar to the notch 12 is not formed in the 1-2 external electrode 32. Thus, by identifying the position of the notch 12, the orientations of the longitudinal direction (the first direction X) and the lateral direction (the second direction Y) of the chip part 1 can be identified from outside the chip part 1. In this embodiment, the notch 12 is formed by selectively removing a corner of the substrate 2 opposite to a corner of the 1-1 external electrode 31. Alternatively, a total of two notches 12 may be formed individually on a pair of corners corresponding to the side of the first side surface 7 of the substrate 2 in the first direction X. However, from the perspective of an indicator for the direction of the chip part 1, the notch is preferably formed corresponding to one corner, as shown in FIG. 1 and FIG. 2. Thus, the chip part 1 having a rectangular shape in the plan view can be asymmetric in either of the aspects of line symmetry (for example, line symmetry about a line along the first direction X and the second direction Y as the axis of symmetry) and dot symmetry.

The 1-2 external electrode 32 forms a quadrilateral shape in the plan view. The four side surfaces 321 to 324 of the 1-2 external electrode 32 may include a pair of a first side surface 321 and a second side surface 322 opposite to each other in the first direction X, and a pair of a third side surface 323 and a fourth side surface 324 opposite to each other in the second direction Y. The 1-2 external electrode 32 is disposed to have the side surfaces 321 to 324 of the 1-2 external electrode 32 be respectively parallel to the side surfaces 7 to 10 of the substrate 2. The 1-2 external electrode 32 covers substantially an entirety of a half of the first main surface 5 on the side of the second side surface 8 with respect to the gap 11.

The gap 11 between the 1-1 external electrode 31 and the 1-2 external electrode 32 is a region sandwiched between the second side surface 312 of the 1-1 external electrode 31 and the second side surface 322 of the 1-2 external electrode 32. The first external electrode 3 is divided into two electrodes including the 1-1 external electrode 31 and the 1-2 external electrode 32 by the gap 11. A peripheral space 13 is formed on the periphery of the 1-1 external electrode 31 and the 1-2 external electrode 32 due to a dimension difference between the first external electrode 3 and the substrate 2. The periphery space 13 may also be, for example, a region between the side surfaces 311 to 314 and 321 to 324 of the 1-1 external electrode 31 and the 1-2 external electrode 32 except for the second side surfaces 312 and 322, and the side surfaces 7 to 10 of the substrate 2. In this embodiment, the peripheral space 13 may also be a portion exposed as a square loop from an insulative portion on the first main surface 5 of the substrate 2.

The gap 11 has a first end 14 and a second end 15 on an opposite side in the second direction Y. The first end 14 and the second end 15 of the gap 11 are open in midway of the peripheral space 13 in the first direction X. Thus, the gap 11 are integrally connected to the peripheral space 13 at the two ends 14 and 15. Moreover, the gap 11 is symmetrical with the first end 14 and the second end 15 being symmetrically positioned. For example, referring to FIG. 2, if the substrate 2 is rotated 180° about a center C of an object located at the center of gravity of the rectangular substrate 2, the first end 14 is consistent with the second end 15. Moreover, if the substrate 2 is flipped about an axis of symmetry A passing through the center of gravity of the substrate 2 and parallel to the first direction X, the first end 14 is consistent with the second end 15. That is to say, in this embodiment, the linear gap 11 has a plane shape with dot symmetry and line symmetry.

The second external electrode 4 is disposed on the second main surface 6. The second external electrode 4 is formed to cover an entirety of the second main surface 6. The second external electrode 4 has a shape consistent with that of the second main surface 6, and has side surfaces 16 to 19 consistent with the side surfaces 7 to 10 of the substrate 2. The four side surfaces 16 to 19 may be a pair of a first side surface 16 and a second side surface 17 opposite to each other in the first direction X and consistent with the first side surface 7 and the second side surface 8, and a pair of a third side surface 18 and a fourth side surface 19 opposite to each other in the second direction Y and consistent with the third side surface 9 and the fourth side surface 10. The second external electrode 4 is in direct contact with the substrate 2, and is electrically and mechanically connected at the substrate 2. The first external electrode 3 and the second external electrode 4 are selectively disposed on the first main surface 5 and the second main surface 6 of the substrate 2, respectively. Thus, in this embodiment, the side surfaces 7 to 10 of the substrate 2 may be exposed surfaces not covered by electrode films of the first external electrodes 3 and the second external electrode 4 and hence exposed from the semiconductor surface of the substrate 2. [Section structure of chip part 1]

Figure 4:
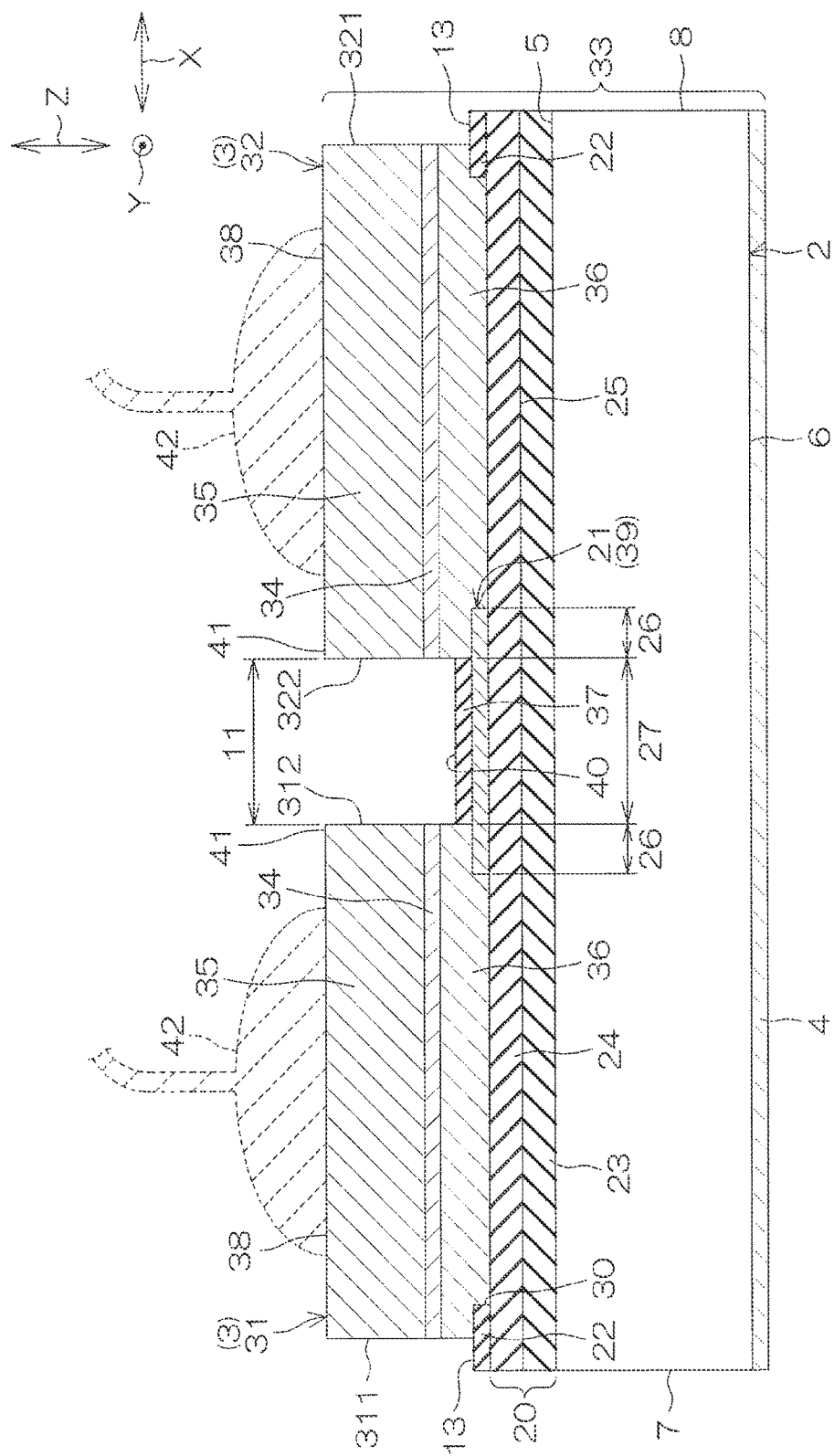
FIG. 4 is a schematic section diagram of the chip part.
Figure 5:
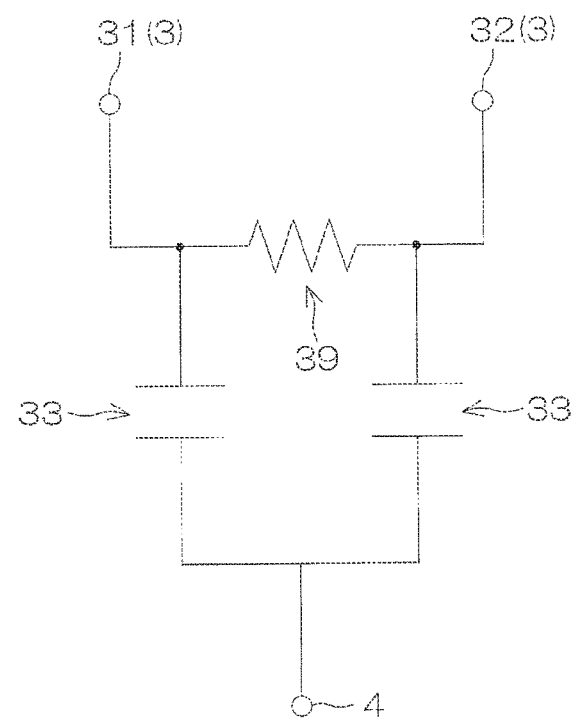
FIG. 5 is a circuit diagram of an electrical configuration of the chip part.

FIG. 4 shows a schematic section diagram of the chip part 1. FIG. 5 shows a circuit diagram of an electrical configuration of the chip part 1. Moreover, FIG. 4 shows a schematic diagram of the laminated structure on the first main surface 5 of the chip part 1, but is not a cross section along any specific section line in FIG. 2.

Referring to FIG. 4, a capacitive film 20, a resistance layer 21 and a surface insulating film 22 are laminated on the first main surface 5 of the substrate 2.

The capacitive film 20 is formed to cover an entirety of the flat first main surface 5 of the substrate 2. Thus, the capacitive film 20 has an end surface consistent with the side surfaces 7 to 10 of the substrate 2. The term "the flat first main surface" 5 may be defined as, there are not recessed such as trenches intentionally formed by means of etching on the first main surface 5 such that the surface of a forming surface of a component formed by a semiconductor wafer can be kept as a flat surface. The thickness of the capacitive film 20 may be between 100 angstroms (Å) and 1000 Å (between 10 nm and 100 nm).

The capacitive film 20 may be a $SiO_2$ film or a silicon nitride (SiN) film, and a laminated film of the above. For example, the capacitive film 20 may also be a $SiO_2$/SiN laminated film, or a $SiO_2$/SiN/$SiO_2$ laminated film. Moreover, the capacitive film 20 may also be an oxide-nitride (ON) film, or an oxide-nitride-oxide (ONO) film, or may be a laminated film of the above. Further, the capacitive film 20 may also be an insulating film including a high dielectric material (high-k material). A high dielectric material, in addition to aluminum oxide ($Al_2O_3$), tantalum pentoxide ($Ta_2O_5$), titanium pentoxide ($Ti_3O_5$) and hafnium oxide ($HfO_2$), the high dielectric material may further include, for example, perovskite compounds such as strontium titanate ($SrTiO_3$) and barium strontium titanate ($Ba_4Sr_{1-x}$) $TiO_3$. In this embodiment, the capacitive film 20 is formed by a $SiO_2$ film.

The capacitive film 20 may also include a first portion 23 and a second portion 24. The first portion 23 and the second portion 24 are both portions of the capacitive film 20, but are portions formed by different manufacturing methods from each other. For example, the first portion 23 is a portion in direct contact with the first main surface 5 of the substrate 2, and may be formed by thermal oxidizing the first main surface 5 of the substrate 2. The second portion 24 is formed on the first portion 23 and is a portion forming the surface of the capacitive film 20, and may be formed by depositing an insulating material by means of, for example, chemical vapor deposition (CVD), on the first portion 23. A boundary 25 may be formed between the first portion 23 and the second portion 24, as shown in FIG. 4, or the boundary 25 may be omitted (or it may be considered that the boundary 25 cannot be identified). When the boundary 25 is not formed, the capacitive film 20 may be defined as an insulating film formed by one single layer. On the other hand, when the boundary 25 is formed, the first portion 23 may be a lower-layer film formed on the first main surface 5, and the second portion 24 may be an upper-layer film formed on the first portion 23 (the lower-layer film).

The resistance layer 21 is formed between the first external electrode 3 and the capacitive film 20. The resistance layer 20 is formed on the capacitive film 20 to be in direct contact with the capacitive film 20. The resistance layer 21 is formed across the 1-1 external electrode 31 and the 1-2 external electrode 32 that are adjacent and spaced by the gap 11. Thus, the resistance layer 21 includes a covered region 26 covered by the first external electrode 3, and an exposed region 27 exposed from the gap 11 between the 1-1 external electrode 31 and the 1-2 external electrode 32.

Referring to FIG. 1, FIG. 2 and FIG. 4, in this embodiment, the resistance layer 21 is formed as a quadrilateral shape in the plan view. In the resistance layer 21 that is a quadrilateral shape in the plan view and in the first direction X, the exposed region 27 is sandwiched between the covered region 26 covered by the 1-1 external electrode 31 and the covered region 26 covered by 1-2 external electrode 32. Thus, in the resistance layer 21, the covered region 26, the exposed region 27 and the covered region 26 respectively extending as strip shapes in the second direction Y are sequentially arranged as a strip shape along the first direction X.

Referring to FIG. 1 and FIG. 2, the resistance layer 21 is arranged substantially in a center between the first end 14 and the second end 15 of the gap 11 in the plan view. More specifically, the resistance layer 21 is spaced from each of the first end 14 and the second end 15 along the longitudinal direction (the second direction Y) of the linear gap 11 and disposed substantially in the center of the linear gap 11. Thus, the resistance layer 21 may also include a first end 28 inside the first end 14 in the second direction Y with respect to the gap 11 in the plan view, and a second end 29 inside the second end 15 in the second direction Y with respect to the gap 11.

The resistance layer 21 may be made of a resistor material including Ti, for example, a titanium nitride (TiN) film, a titanium oxynitride (TiON) film or a TiSiON film. Moreover, the resistance layer 21 may also be a polysilicon layer. If the resistance layer 21 is made of a resistor material including Ti, compared to a situation of a polysilicon material, the resistance value of the resistance layer 21 can be designed to be a lower value. On the other hand, if the resistance layer 21 is made of a polysilicon material, the resistance value of the resistance layer 21 can be designed to be a higher value. Moreover, by adjusting the concentration of impurities included in the polysilicon layer, the resistance value of the resistance layer 21 can be easily adjusted. Moreover, the thickness of the resistance layer 21 may be between 500 Å and 2000 Å (between 50 nm and 200 nm).

The surface insulating film 22 is disposed on the capacitive film 20. The surface insulating film 22 may be a $SiO_2$ film or a SiN film, or a laminated film of the above. The thickness of the surface insulating layer 22 may be, for example, between 10000 Å and 15000 Å (between 1 μm and 1.5 μm). An opening 30 that exposes the capacitive film 20 is formed on the surface insulating film 22. Referring to FIG. 2, the opening 30 is not formed in one-on-one correspondence with respect to each of the 1-1 external electrode 31 and the 1-2 external electrode 32, but is formed as one large opening that is formed across substantially the entirety of the first main surface 5 of the substrate 2 to expose the capacitive film 20. Thus, the resistance layer 21 is not covered by the surface insulating film 22, and the surface insulating film 22 surrounds the resistance layer 21 at an interval outside the resistance layer 21.

The first external electrode 3 is disposed on the capacitive film 20. The first external electrode 3 is opposite to the semiconductor substrate 2 interposed by the capacitive film 20 in the opening 30. In the chip part 1, a capacitor 33 is formed by the capacitive film 20, and the first external electrode 3 (an upper electrode) and the substrate 2 (a lower electrode) interposed by the capacitive film 20. The first external electrode 3 may also include a laminated film including a plurality of conductive layers. For example, the first external electrode 3 may also include a first layer 34 and a second layer 35 sequentially laminated from the substrate 2. The first layer 34 also be referred to as, for example, a sputtering layer including Au. The second layer 35 also be referred to as, for example, a plating layer including Au. When the first layer 34 and the second layer 35 are formed by the same material, there may be no boundary between the two. The second layer 35 may be thicker than the first layer 34. For example, the first layer 34 may be, for example, between 300 Å and 1000 Å, and the second layer 35 may be between 1 μm and 3 μm.

In this embodiment, the first external electrode 3 is not directly formed on the capacitive film 20, but an adhesion layer 36 is formed between the first external electrode 3 and the capacitive film 20. The adhesion layer 36 is a layer that improves adhesion between the first electrode 3 and the capacitive film 20. The material of the adhesion layer 36 is appropriately selected according to the materials of the first external electrode 3 and the capacitive film 20. For example, when the capacitive film 20 is a $SiO_2$ film and the first external electrode 3 is an Au layer, the adhesion layer 36 may also be a TiW layer. Moreover, the thickness of the adhesion layer 36 may be between 1000 Å and 3000 Å (between 100 nm and 300 nm).

The adhesion layer 36 covers the covered region 26 of the resistance layer 21, but does not cover the exposed region 27. In contrast, a protective film 37 is disposed in the exposed region 27. The protective film 27 covers the exposed region 27 of the resistance layer 21 in the entirety of the longitudinal direction (the second direction Y) of the gap 11. The protective film 37 may also be a $SiO_2$ film or a SiN film, or a laminated film of the above. Moreover, the thickness of the protective film 37 may be between 300 Å and 1500 Å (between 30 nm and 150 nm). The protective film 37 may also be thinner than the adhesion layer 36 and the first external electrode 3. Thus, the protective film 37 has an upper surface 40 located on the substrate 2 with respect to an upper surface 38 of the first external electrode 3. Thus, the second side surfaces 312 and 322 of the first external electrodes 3 are exposed from the gap 11, and a peripheral edge 41 of the upper surface 38 of the first electrode 3 forms a boundary with the second side surfaces 312 and 322 exposed in an upper region of the protective film 37. The upper surface 38 of the first electrode 3 is exposed at the peripheral edge 41, and hence, for example, a larger bonding space for a bonding component such as a bonding line 42 can be ensured in the upper surface 38 of the first electrode 3.

The second external electrode 4 is directly disposed on the second main surface 6. The second external electrode 4 is electrically connected to the substrate 2. Thus, the second external electrode 4 and the substrate 2 connected to each other may also be together defined as a lower electrode of the capacitor 33. In this case, the lower electrode of the capacitor 33 may be defined as including a semiconductor layer connected to the capacitive film 20 and a metal layer disposed on a surface opposite to the capacitive film 20 on the semiconductor layer. Moreover, the second external electrode 4 may be, for example, a Ni/Pd/Au laminated film sequentially including a Ni film, a Pd film and an Au film from the substrate 2.

In this embodiment, the first external electrode 3 and the second external electrode 4 form external terminals of the capacitor 33. The chip part 1 can be, for example, bonded on the substrate via the second external electrode 4, and bonded to the first external electrode 3 by a lead wire for further use. Moreover, the first external electrode 3 and the second external electrode 4 may also be referred to as a first terminal electrode and a second terminal electrode, respectively, or be referred to as a first external terminal and a second external terminal.

According to the chip part 1, the first external electrode 3 is opposite to the substrate 2 (the second external electrode 4) interposed by the capacitive film 20 in between. Thus, a vertical capacitor 33 having a laminated structure of the upper electrode-capacitive film 20-lower electrode is formed in the longitudinal direction along the thickness direction of the substrate 2. On the other hand, the first external electrode 3 includes the 1-1 external electrode 31 and the 1-2 external electrode 32 separated from each other, and the resistance layer 21 crosses the 1-1 external electrode 31 and the 1-2 external electrode 32. Thus, the resistance layer 21 is connected in series between the 1-1 external electrode 31 and the 1-2 external electrode 32 to form a horizontal resistance element 39 in which a current flows in the lateral direction of the first main surface 5 of the substrate 2. FIG. 5 shows a circuit diagram of electrical connections of the capacitor 33 and the resistance element 39.

As such, the chip part 1 is a composite element in which the vertical capacitor 33 and the horizontal resistance element 39 are formed on the common substrate 2 (the vertical capacitor 33 and the horizontal resistance element 39 are integrated on one substrate 2). Because the first external electrode 3 of the vertical capacitor 33 serves as a terminal of the horizontal resistance element 39, a region for the capacitor 33 and a region for the resistance element 39 can be formed in an overlapping manner on the first main surface 5 of the substrate 2. Thus, the space of the first main surface 5 of the substrate 2 can be efficiently utilized, thereby providing the chip part 1 including a small-size composite element. Moreover, because the 1-1 external electrode 31 and the 1-2 external electrode 32 are separated from each other, compared to a situation where the 1-1 external electrode 31 and the 1-2 external electrode 32 are formed as one integral single electrode layer, the stress transferred from the first external electrode 3 to the capacitive film 20 can be reduced. Thus, warping of the substrate 2 can be mitigated.

[Manufacturing Method of Chip Part 1]

FIG. 6A to FIG. 6M show diagrams of manufacturing steps of the chip part 1 in sequence, and correspond to the cross section in FIG. 4.

Figure 6A:
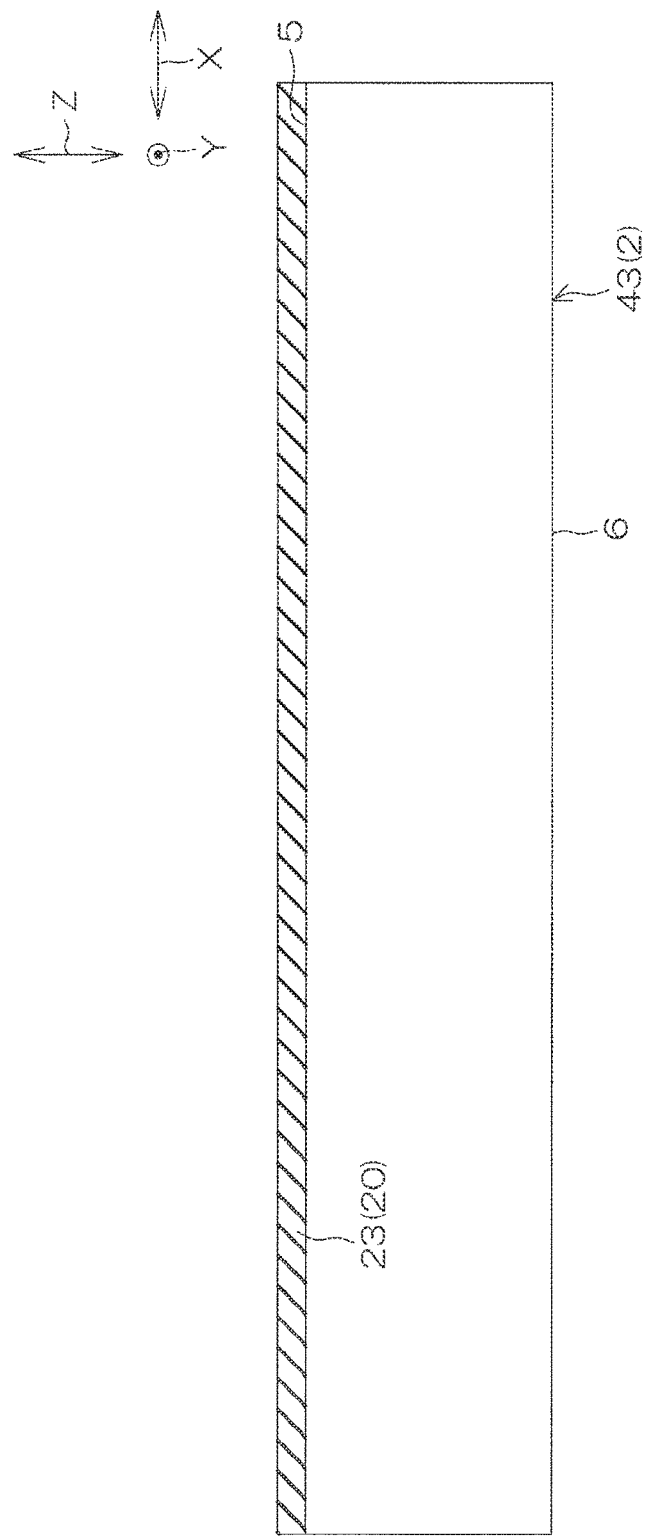
FIG. 6A is a schematic section diagram of a part of a manufacturing step of the chip part.
Figure 6B:
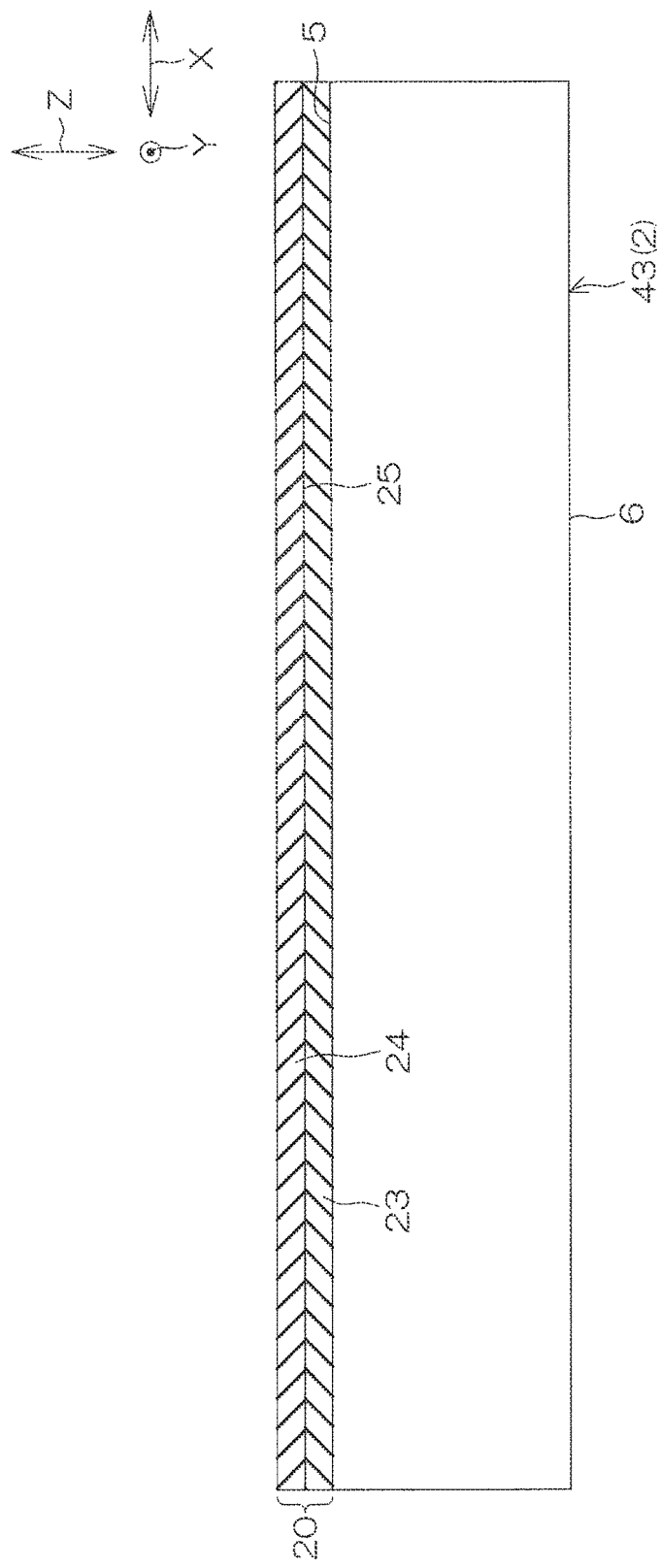
FIG. 6B is a diagram of a next step of FIG. 6A.
Figure 6C:
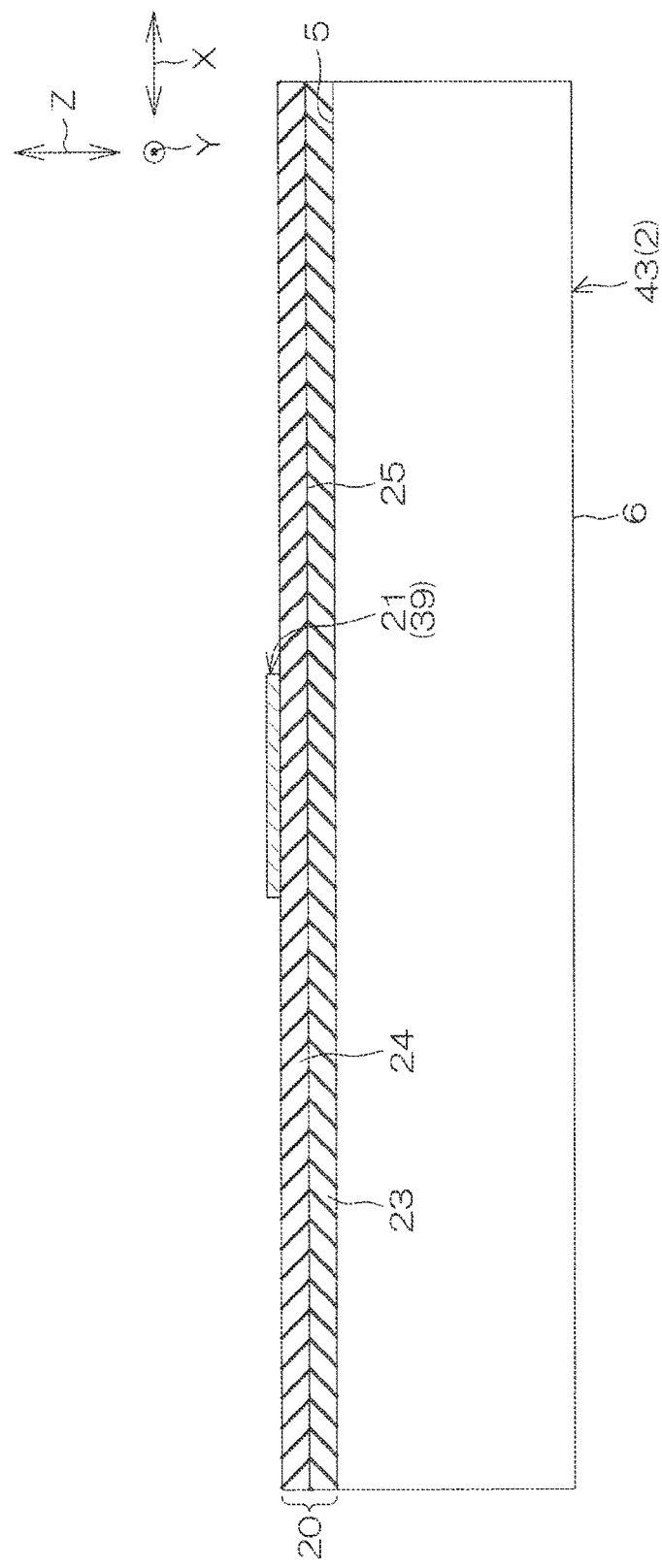
FIG. 6C is a diagram of a next step of FIG. 6B.
Figure 6D:
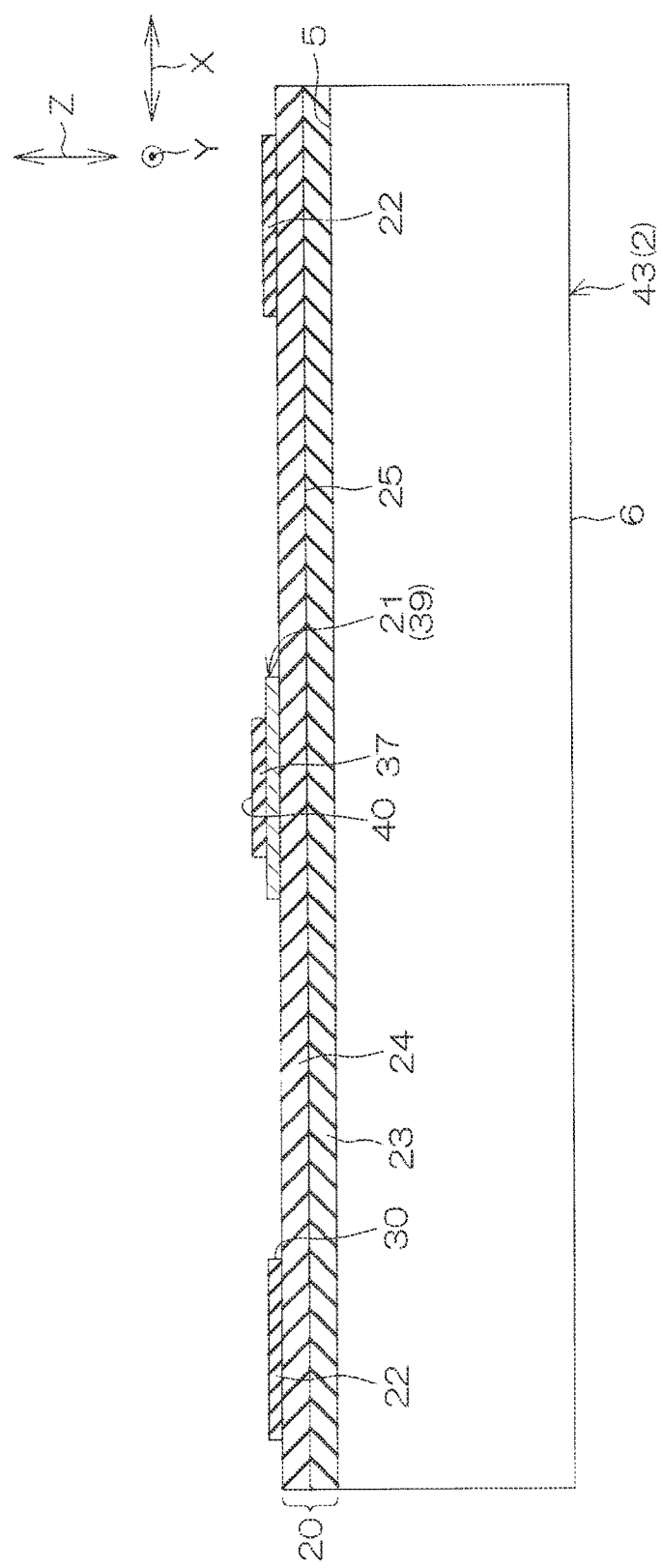
FIG. 6D is a diagram of a next step of FIG. 6C.
Figure 6E:
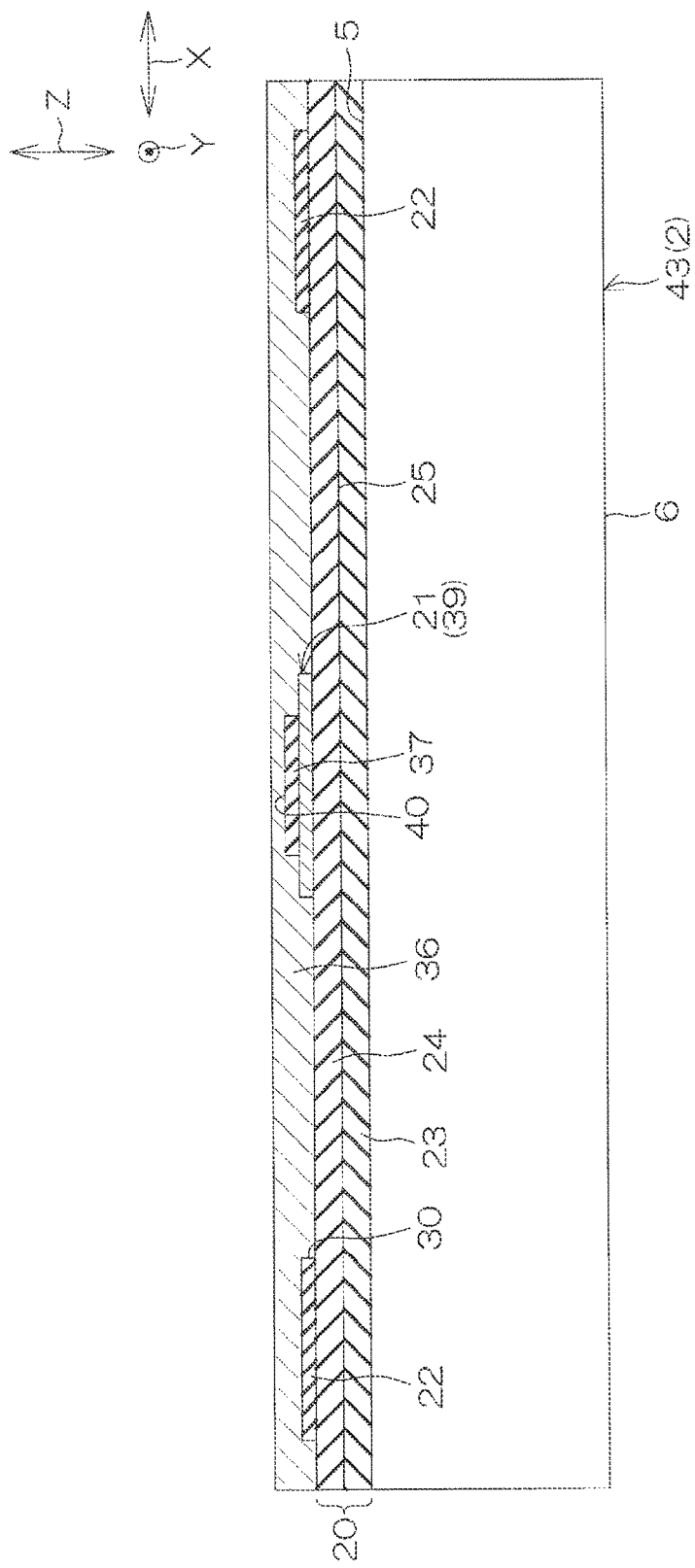
FIG. 6E is a diagram of a next step of FIG. 6D.
Figure 6F:
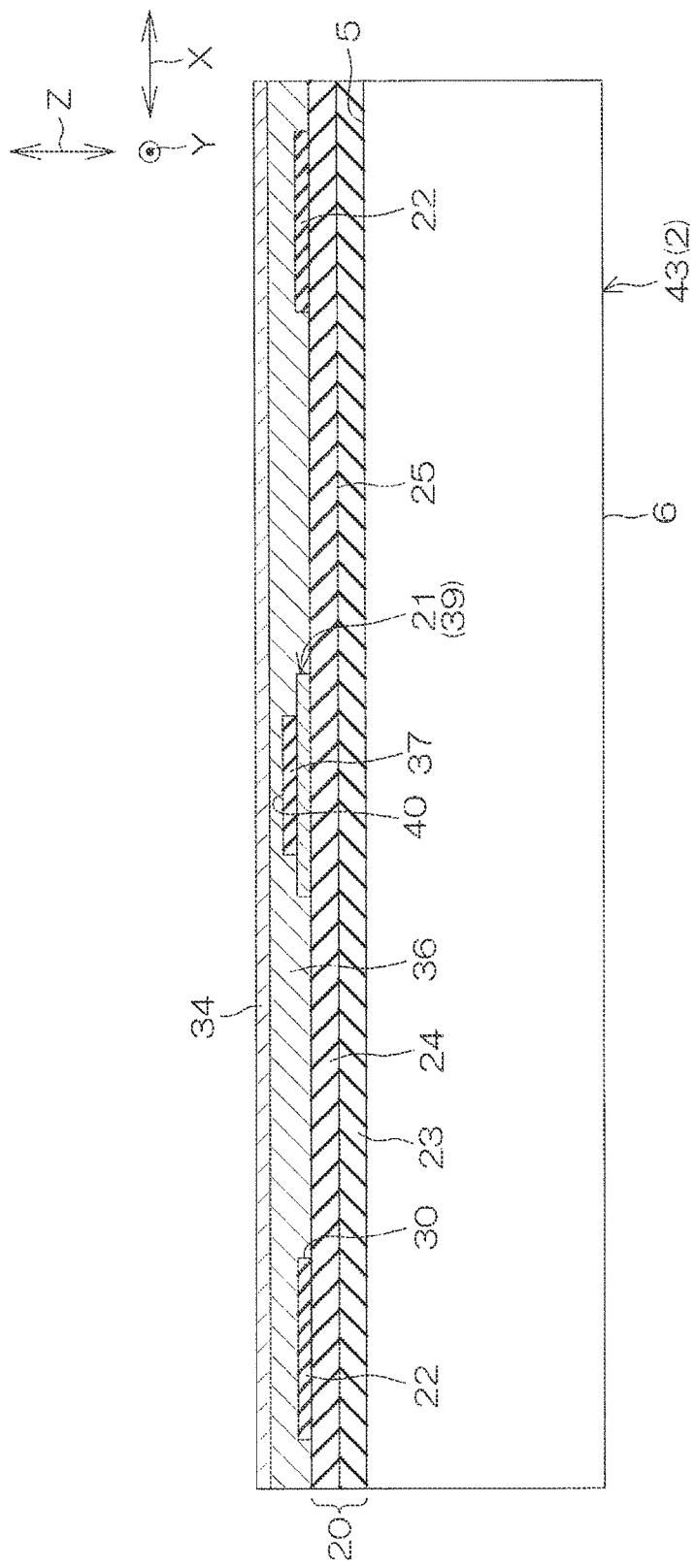
FIG. 6F is a diagram of a next step of FIG. 6E.
Figure 6G:
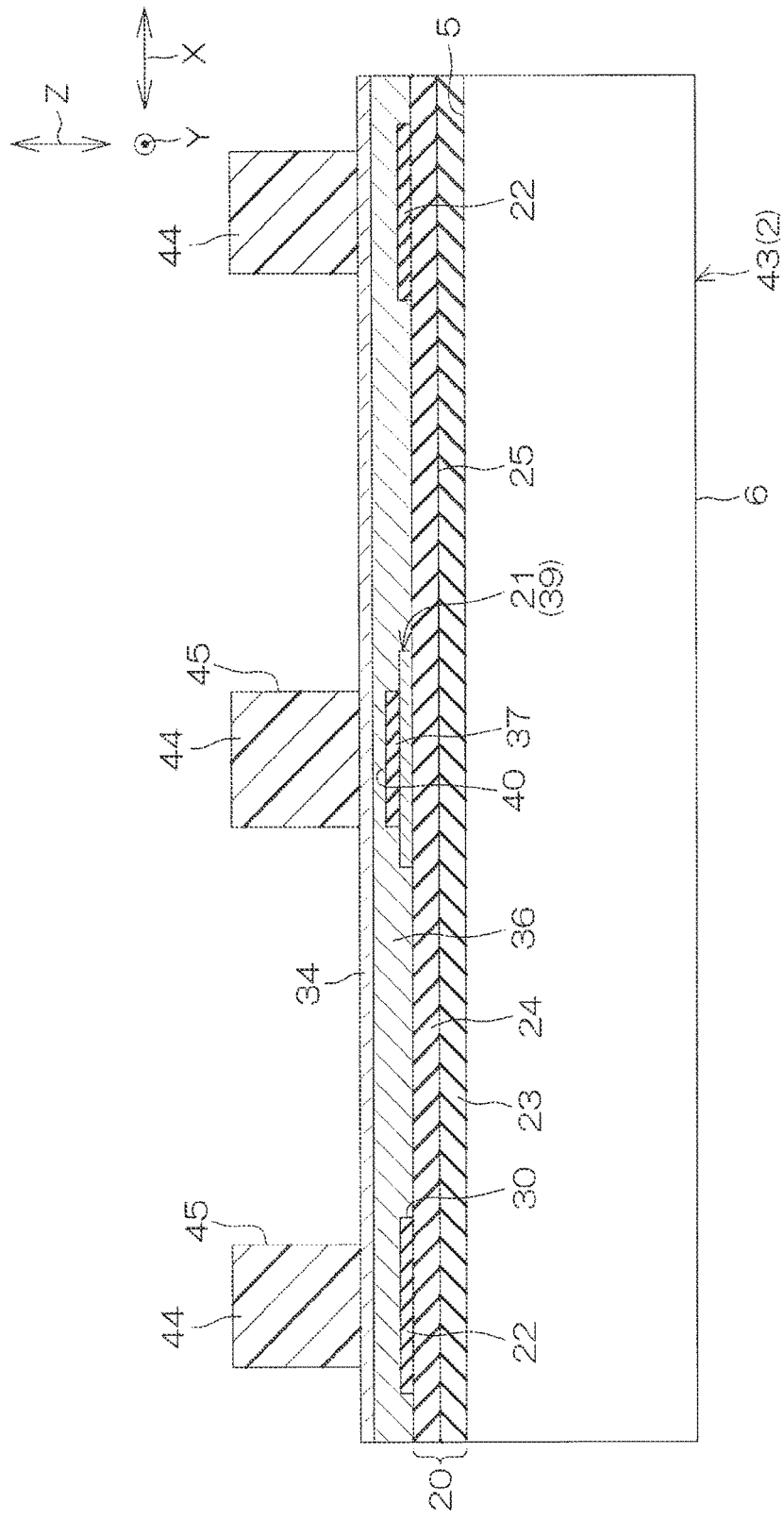
FIG. 6G is a diagram of a next step of FIG. 6F.
Figure 6H:
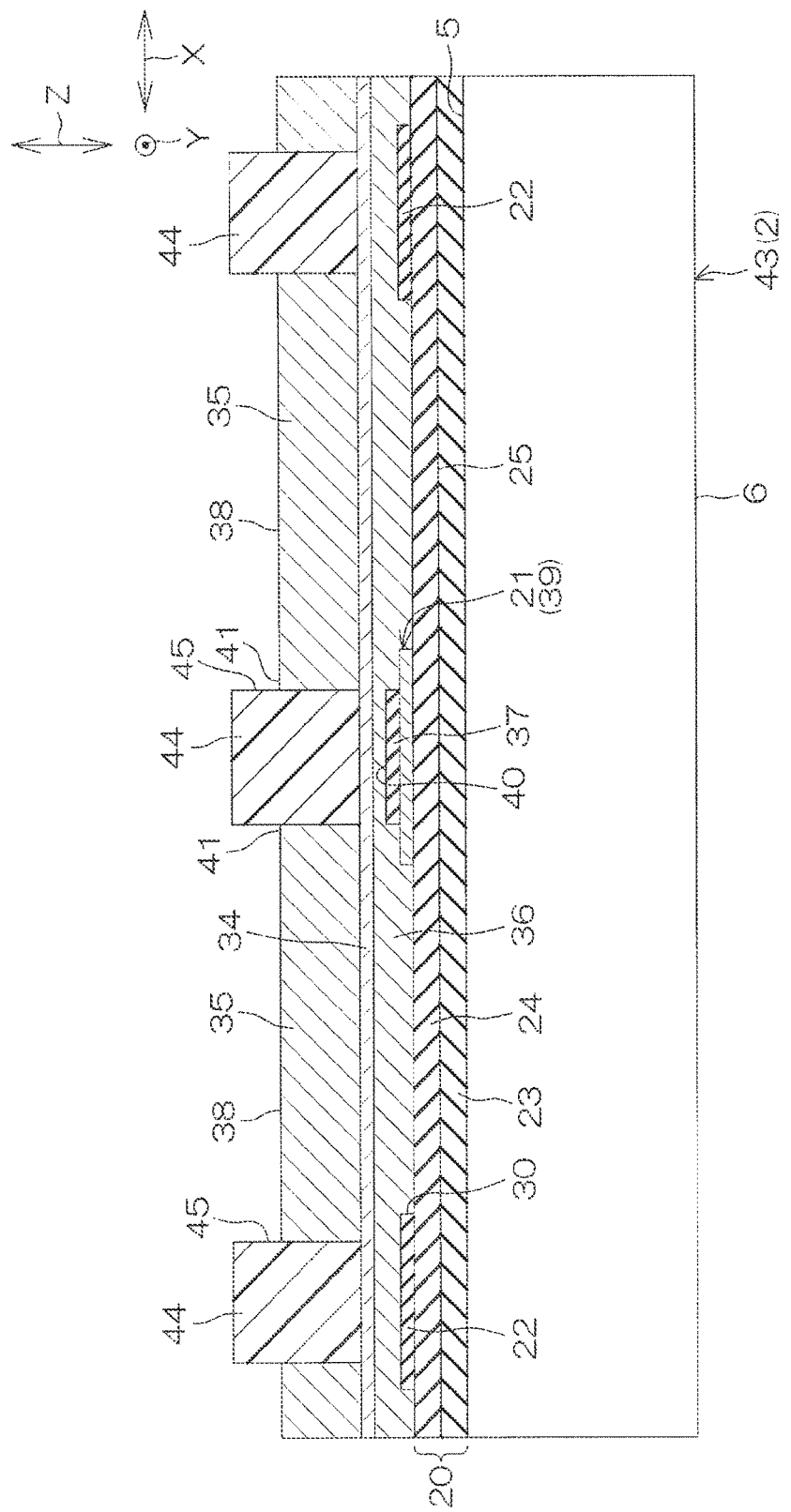
FIG. 6H is a diagram of a next step of FIG. 6G.
Figure 6I:
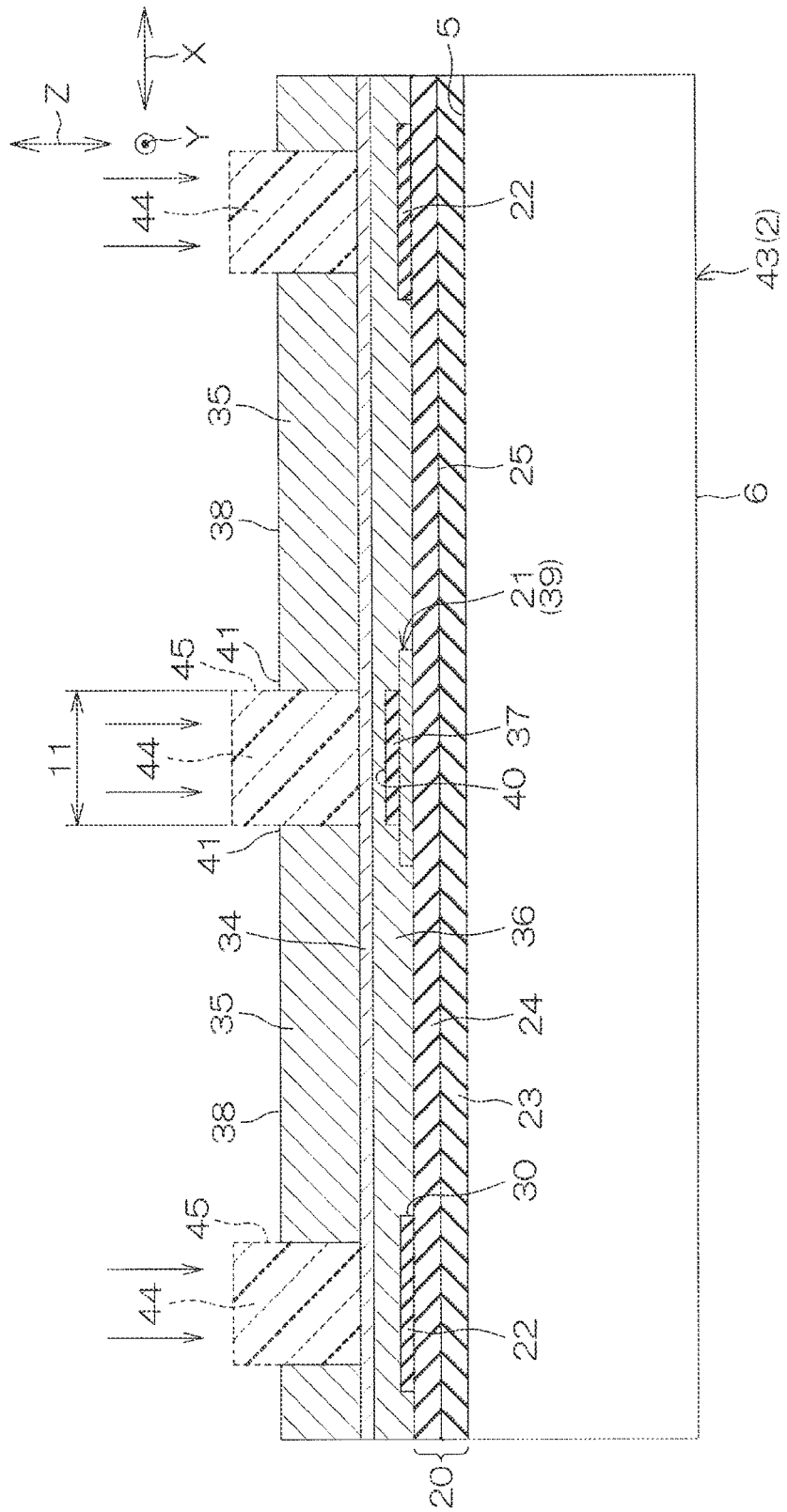
FIG. 6I is a diagram of a next step of FIG. 6H.
Figure 6J:
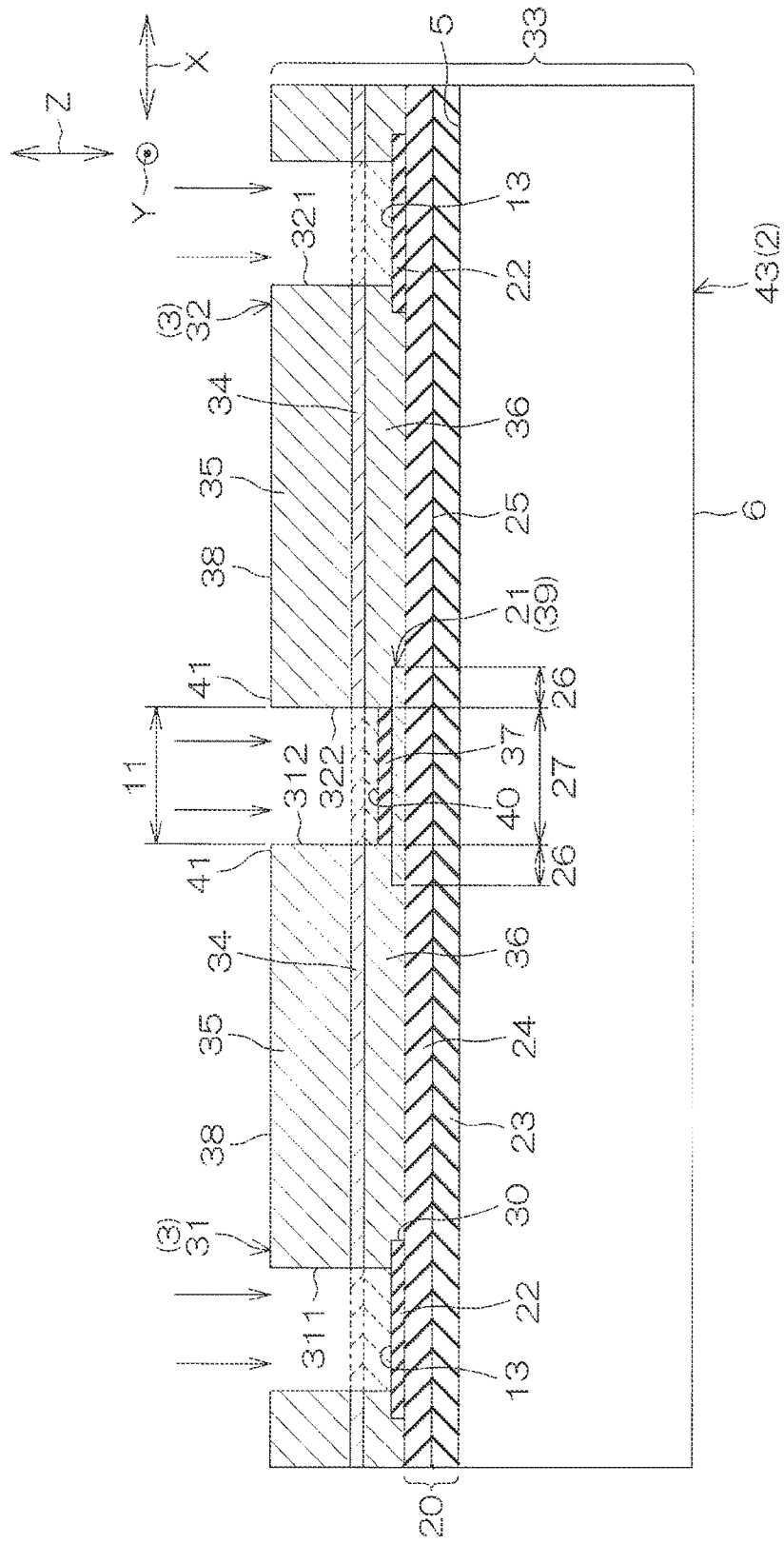
FIG. 6J is a diagram of a next step of FIG. 6I.
Figure 6K:
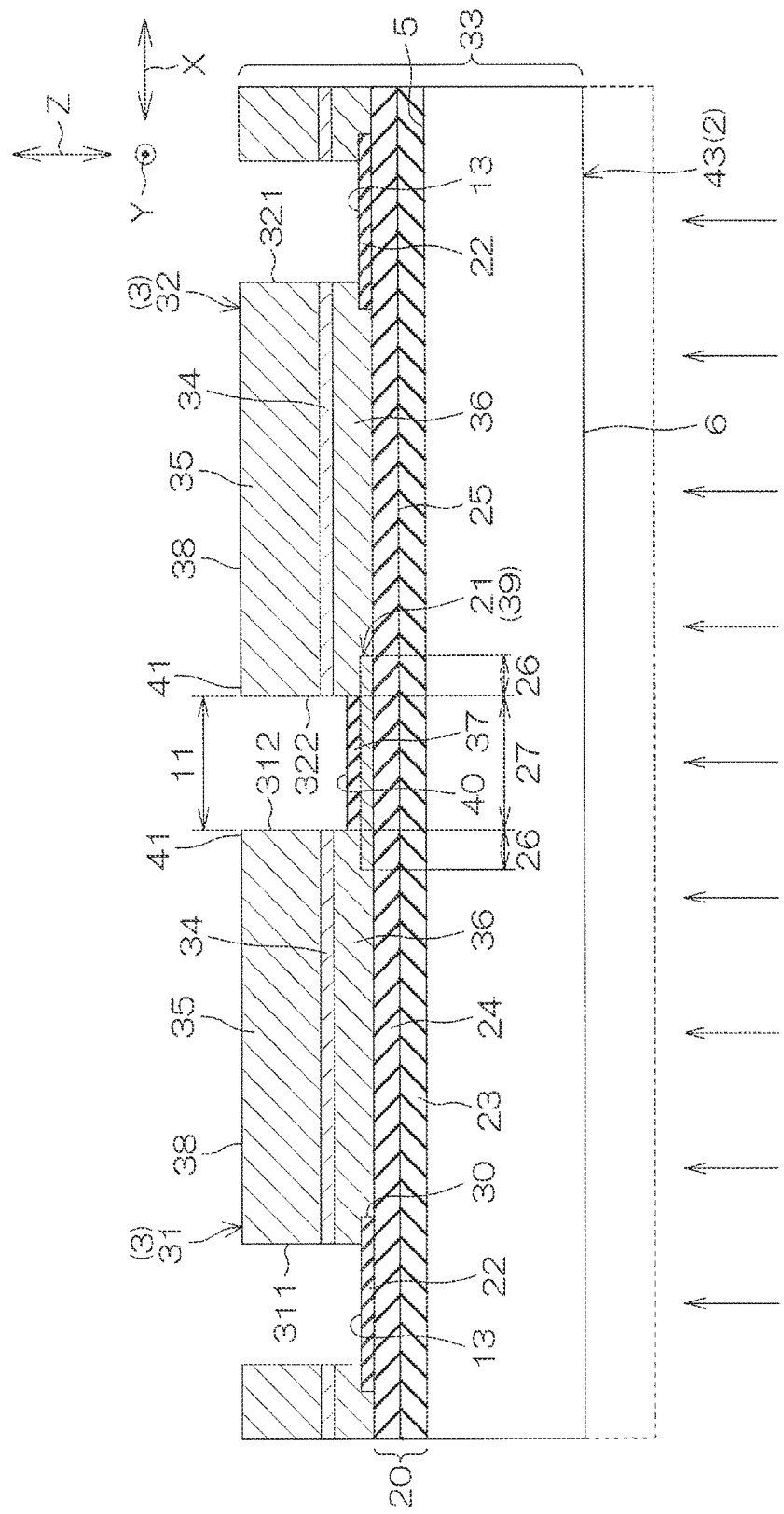
FIG. 6K is a diagram of a next step of FIG. 6J.

To manufacture the chip part 1, first of all, referring to FIG. 6k a wafer 43 to become a base of the substrate 2 is prepared. Then, for example, the first portion 23 (a thermal oxide film) of the capacitive film 20 containing $SiO_2$ is formed by, for example, thermally oxidizing the first main surface 5 of the wafer 43.

Then, referring to FIG. 6B, by CVD, for example, an insulating material is deposited on the first portion 23. Accordingly, the second portion 24 (a CVD film) of the capacitive film 20 is formed on the first portion 23.

Then, referring to FIG. 6C, by means of spluttering, for example, the material of the resistance layer 21 is deposited on the entire surface of the capacitive film 20, and an unwanted part is removed by means of patterning to form the resistance layer 21.

Next, referring to FIG. 6D, by means of CVD, for example, an insulating material of the insulating film 22 and the protective layer 37 is disposed to cover the resistance layer 21. Then, the insulating material is patterned and separated into the surface insulating film 22 and the protective film 37. Moreover, when the surface insulating film 22 and the protective film 37 are made of different insulating materials from each other, different from the embodiment, the surface insulating film 22 and the protective film 37 may be formed by different steps.

Next, referring to FIG. 6E, by means of spluttering, for example, the adhesion layer 36 is disposed on the entire surface of the capacitive film 20 to cover the surface insulating film 22, the protective film 37 and the resistance layer 21.

Next, referring to FIG. 6F, by means of sputtering, for example, the first layer 34 of the first external electrode 3 is formed on the entire surface of the adhesion layer 36.

Next, referring to FIG. 6G, an etch resist 44 is selectively formed on the first layer 34. The etch resist 44 has a plating opening 45 in a region where the first external electrode 3 is to be disposed.

Next, referring to FIG. 6H, the material of the second layer 35 is plated and deposited from the first layer 34, wherein the first layer 34 refers to the first layer 34 exposed from the plating opening 45 of the etch resist 44. The plating deposition may be performed by, for example, electroplating.

Next, referring to FIG. 6I, the etch resist 44 is removed. Thus, a laminated structure of the adhesion layer 36 and the first layer 34 is exposed from the gap 11 between the plurality of second layers 35 separated from each other.

Next, referring to FIG. 6J, by means of dry etching using the second layer 35 as a mask, unnecessary parts in the first layer 34 and the adhesion layer 36 are sequentially removed. More specifically, the first layer 34 and the adhesion layer 36 exposed from the gap 11 are removed. At this point, the resistance layer 21 is covered by the protective film 37. Thus, the surface of the resistance layer 21 can be prevented from being exposed in the etch gas during dry etching. As a result, unintentional cutting and thinning of the resistance layer 21 can be inhibited, thereby enhancing precision reliability of the capacitance value of the capacitor 33. With the etching, a laminated structure in which the adhesion layer 36 and the first external electrode 3 have side surfaces on the same plane is formed.

Next, referring to FIG. 6K, the wafer 43 is ground from the second main surface 6. Thus, the wafer 43 is thinned.

Figure 6L:
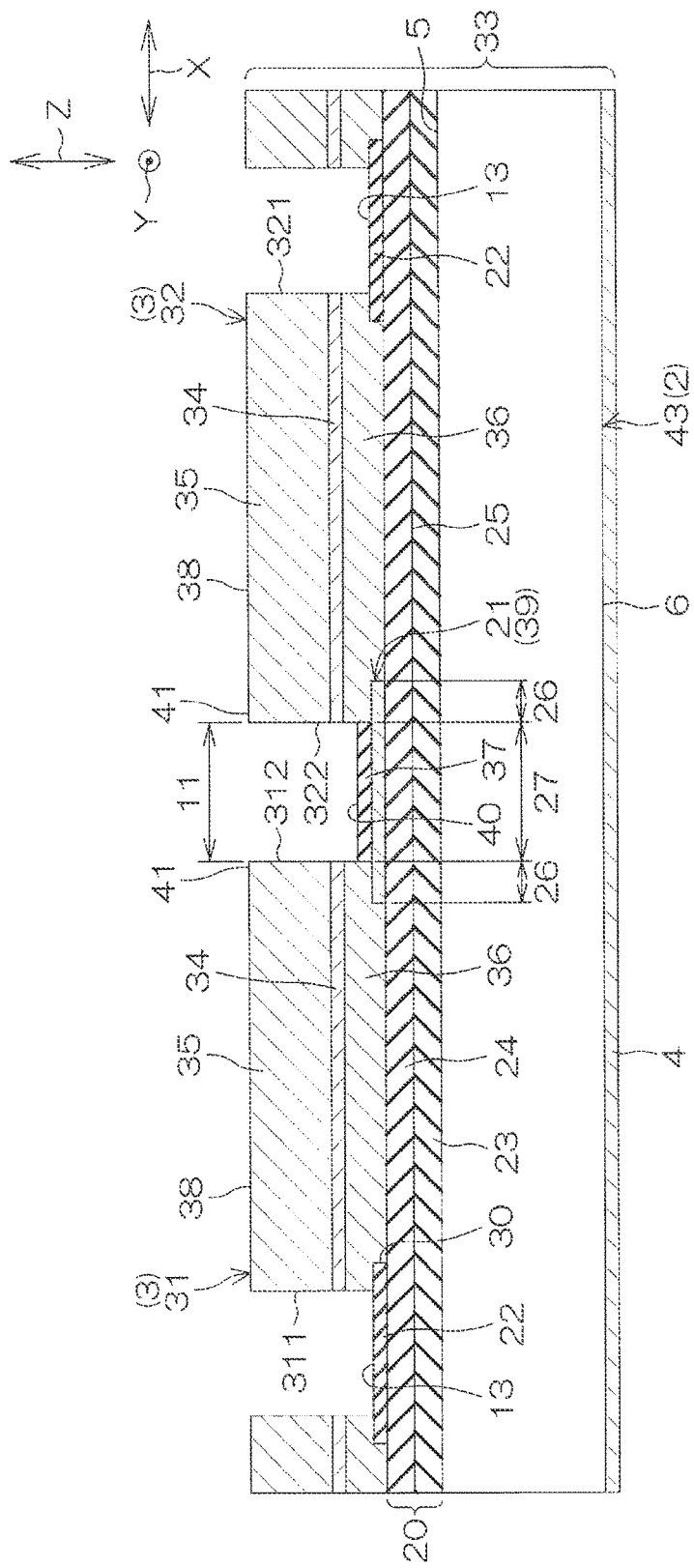
FIG. 6L is a diagram of a next step of FIG. 6K.

Next, referring to FIG. 6L, by means of sputtering, for example, the second external electrode 4 is disposed on the second main surface 6 of the substrate 2.

Figure 6M:
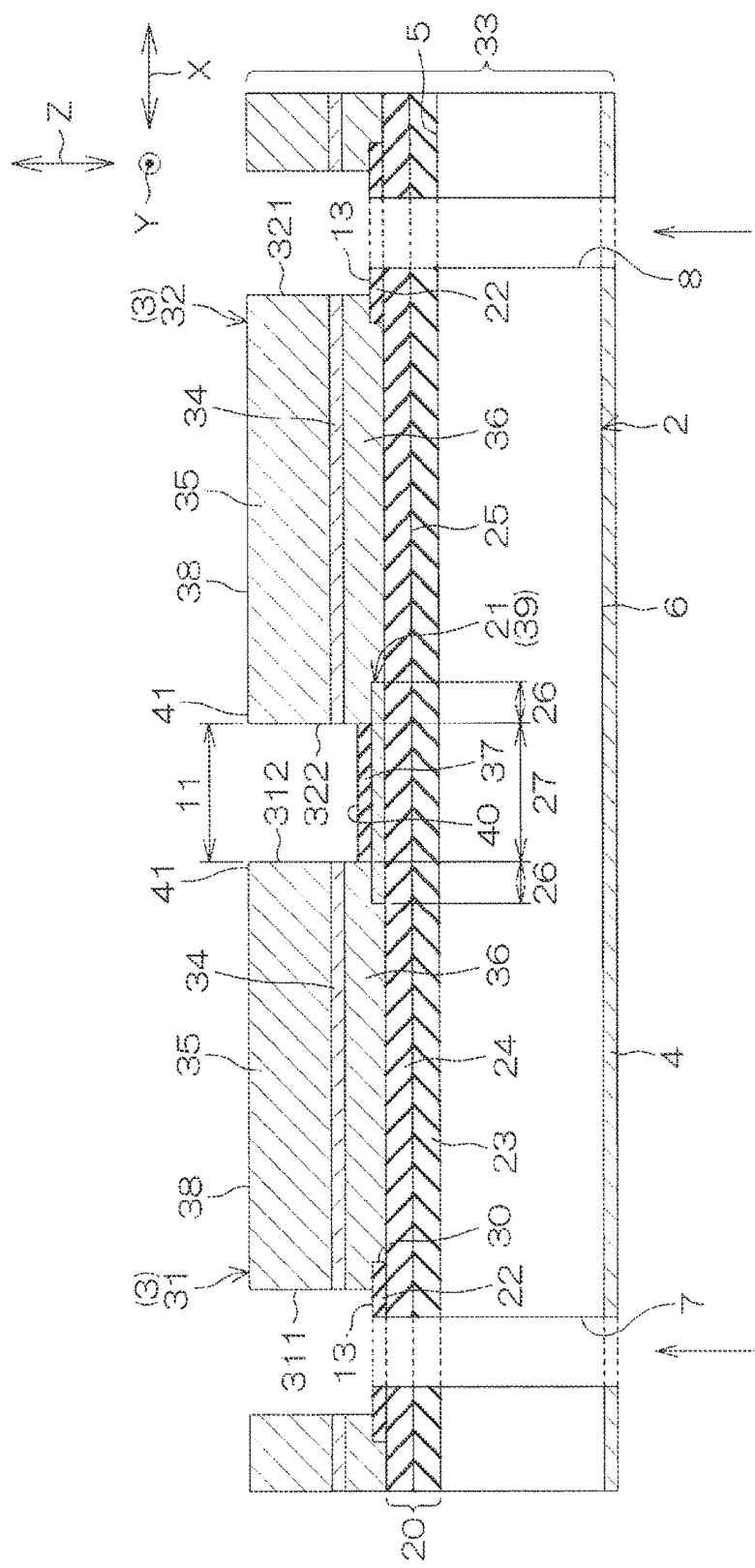
FIG. 6M is a diagram of a next step of FIG. 6L.

Next, referring to FIG. 6M, a cutting blade is inserted on the side of the second main surface 6 of the wafer 43 to cut (disconnect) the wafer 43. Thus, the chip parts 1 are obtained after the cutting. The chip parts 1 can be obtained after the steps above.

[Manufacturing Method of Chip Part 51 to 58]

Next, structures of the chip parts 51 to 58 are described with reference to FIG. 7 to FIG. 14 below. In FIG. 7 to FIG. 14, structures corresponding to the structures described with reference to FIG. 1 to FIG. 5 are given the same numeral and symbols and the repeated details are omitted below. Moreover, in FIG. 7 to FIG. 14, the constituting elements and the reference symbols and numerals required illustrating the features of the chip parts 51 to 58 are extracted and shown.

[Chip Part 51]

Figure 7:
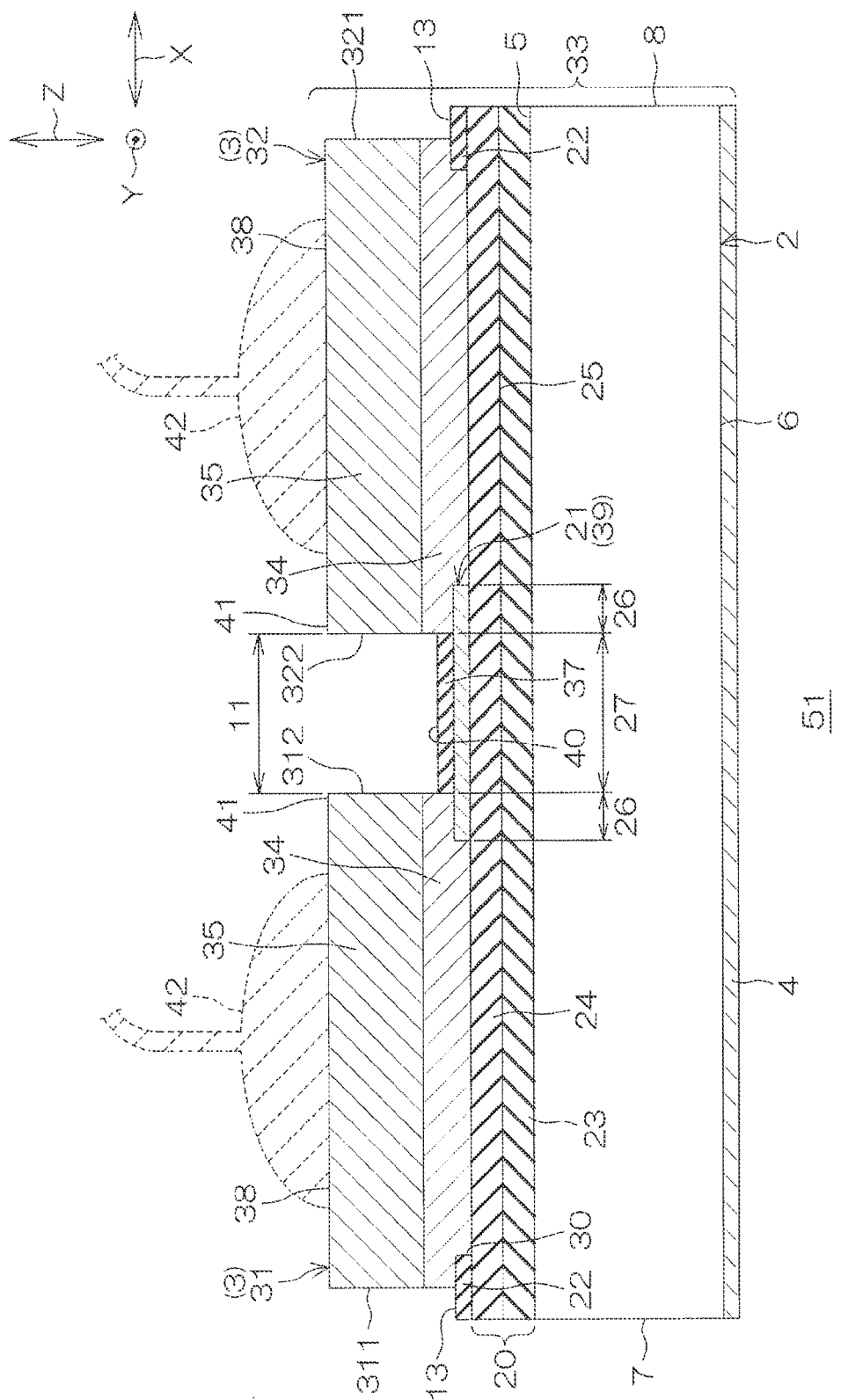
FIG. 7 is a schematic section diagram of the chip part.

FIG. 7 shows a schematic section diagram of the chip part 51. In the chip part 51, the adhesion layer 36 is omitted. Thus, the first external electrode 3 is directly disposed on the capacitive film 20. The first external electrode 3 covers the covered region 26 of the resistance layer 21 to directly be in direct contact with each other.

[Chip Part 52]

Figure 8:
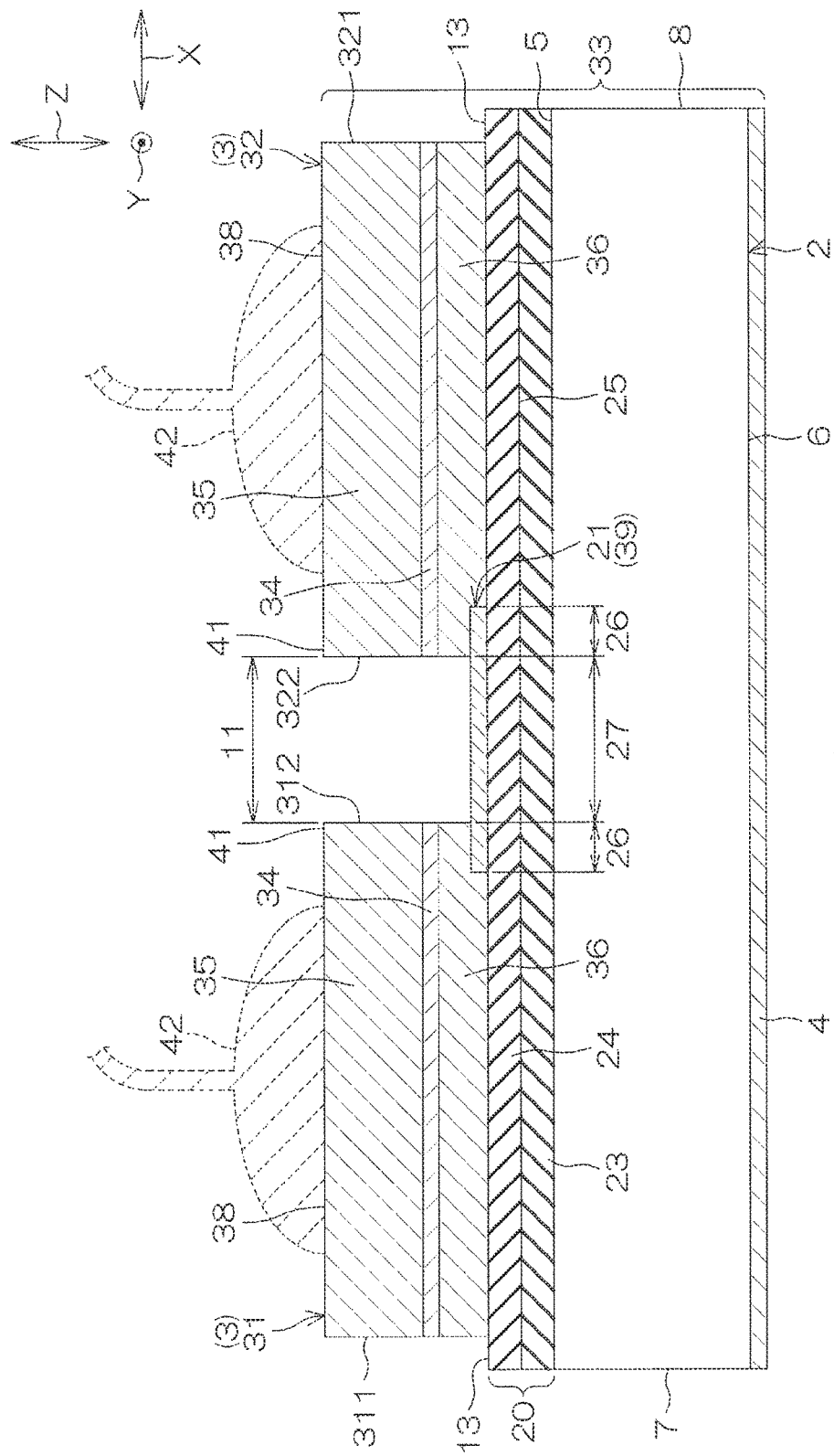
FIG. 8 is a schematic section diagram of the chip part.

FIG. 8 shows a schematic section diagram of the chip part 52. In the chip part 52, the surface insulating film 22 and the protective film 37 are omitted. Thus, the resistance layer 21 is exposed in the gap 11. Moreover, a portion of the capacitive film 20 is exposed as the peripheral space 13.

[Chip Part 53]

Figure 9:
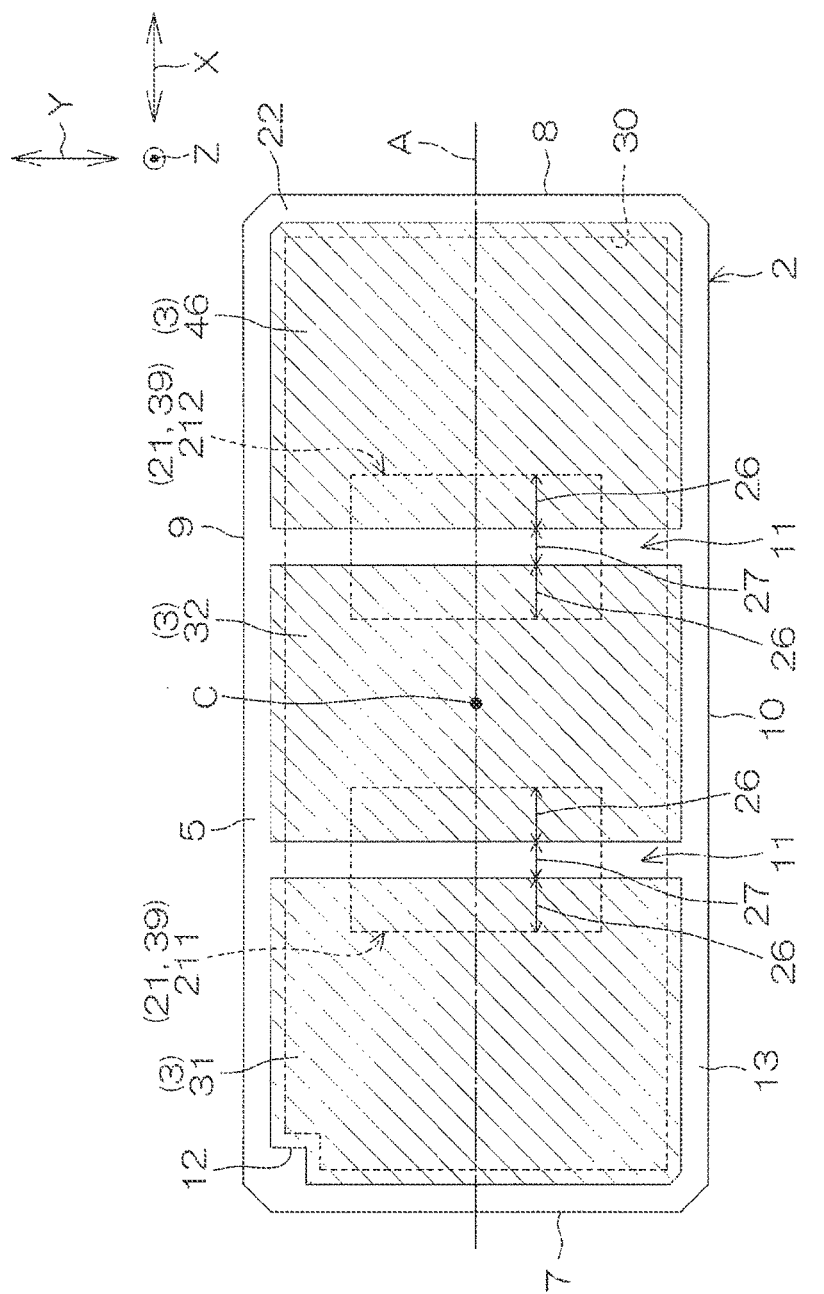
FIG. 9 is a schematic top view of the chip part.

FIG. 9 shows a schematic top view of the chip part 53. In the chip part 53, in addition to the 1-1 external electrode 31 and the 1-2 external electrode 32, the first external electrodes 3 further include a 1-3 external electrode 46. The 1-1 external electrode 31, the 1-2 external electrode 32, and the 1-3 external electrode 46 are divided along the second direction Y in the plan view, and are arranged along the first direction X. The resistance layer 21 may also include a first resistance layer 211 crossing the 1-1 external electrode 31 and 1-2 external electrode 32 adjacent to each other and interposed by the gap 11, and a second resistance layer 212 crossing the 1-2 external electrode 32 and the 1-3 external electrode 46 adjacent to each other and interposed by the gap 11. The first resistance layer 211 and the second resistance layer 212 are physically separated from each other.

[Chip Part 54]

Figure 10:
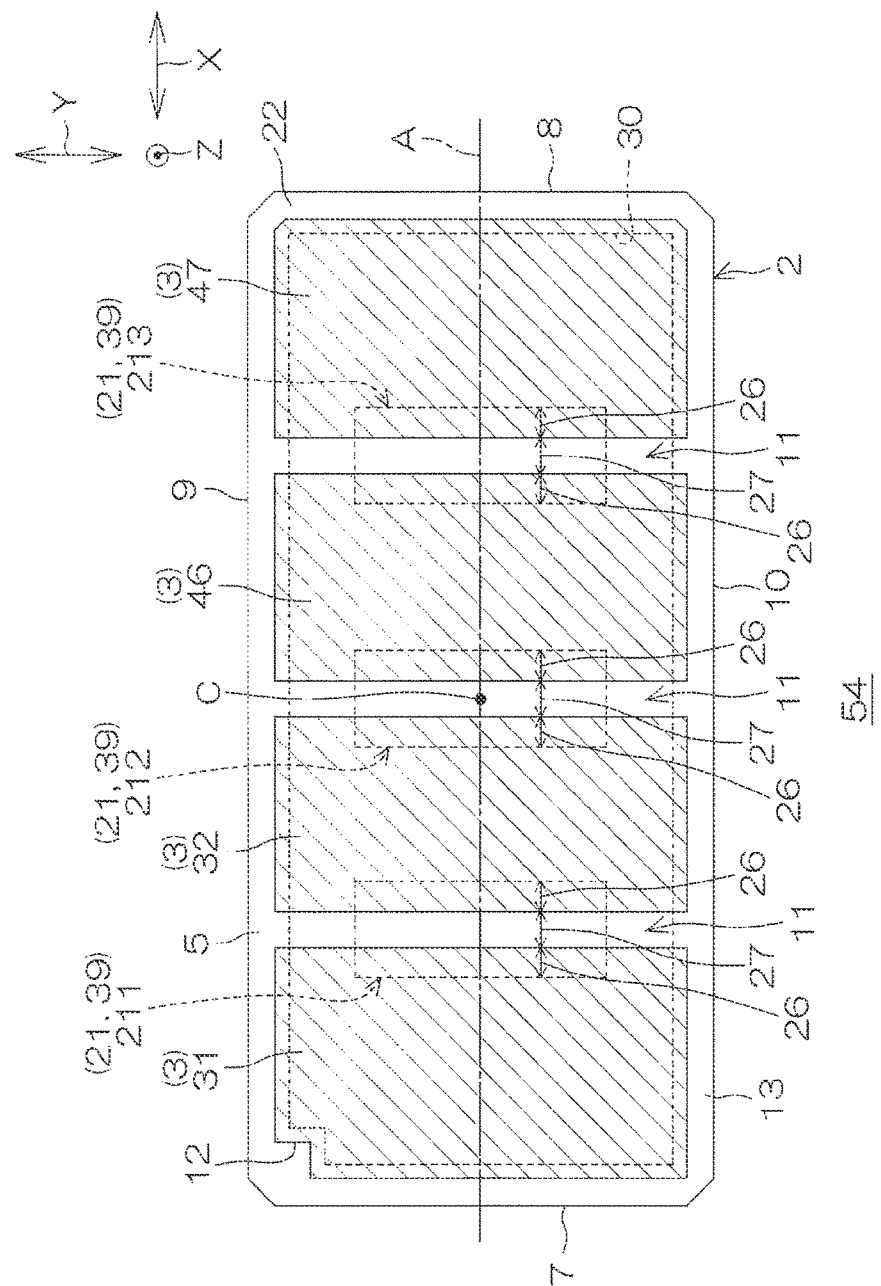
FIG. 10 is a schematic top view of the chip part.

FIG. 10 shows a schematic top view of the chip part 54. In the chip part 54, in addition to the 1-1 external electrode 31 and the 1-2 external electrode 32, the first external electrodes 3 further include a 1-3 external electrode 46 and a 1-4 external electrode 47. The 1-1 external electrode 31, the 1-2 external electrode 32, the 1-3 external electrode 46 and the 1-4 external electrode 47 are divided along the second direction Y in the plan view, and are arranged along the first direction X. The resistance layer 21 may also include a first resistance layer 211 crossing the 1-1 external electrode 31 and 1-2 external electrode 32 adjacent to each other and interposed by the gap 11, a second resistance layer 212 crossing the 1-2 external electrode 32 and the 1-3 external electrode 46 adjacent to each other and interposed by the gap 11, and a third resistance layer 213 crossing the 1-3 external electrode 46 and the 1-4 external electrode 47 adjacent to each other and interposed by the gap 11. The first resistance layer 211, the second resistance layer 212 and the third resistance layer 213 are physically separated from each other.

[Chip Part 55]

Figure 11:
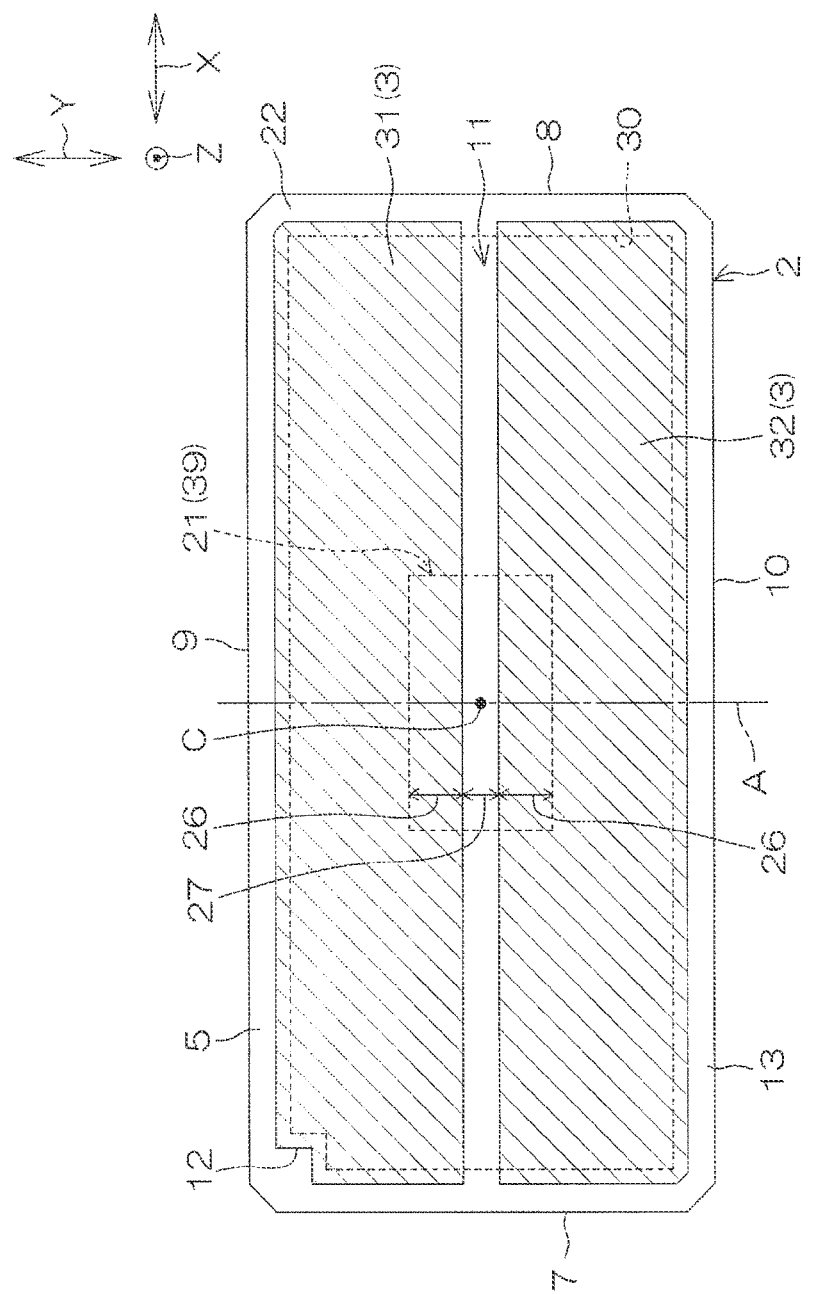
FIG. 11 is a schematic top view of the chip part.

FIG. 11 shows a schematic top view of the chip part 55. In the chip part 55, the 1-1 external electrode 31 and the 1-2 external electrode 32 are divided along the longitudinal direction (the first direction X in this embodiment) of the substrate 2 and arranged in a row along the lateral direction (the second direction Y in this embodiment) of the substrate 2 in the plan view.

[Chip Part 56]

Figure 12:
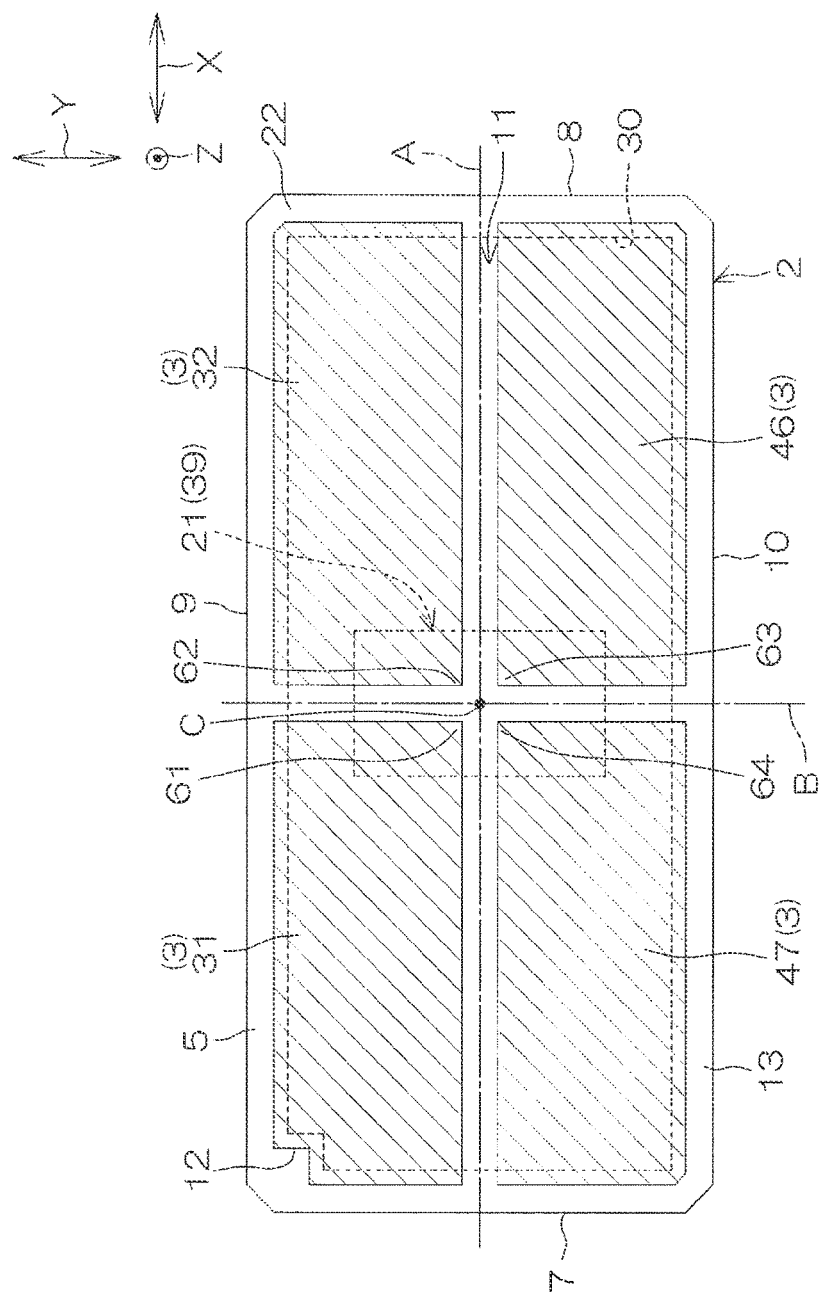
FIG. 12 is a schematic top view of the chip part.

FIG. 12 shows a schematic top view of the chip part 56. In the chip part 56, the first external electrode 3 is divided in both directions including the first direction X and the second direction Y, and is separated into a plurality of first external electrodes 3. More specifically, by the gap 11 that appears as a cross shape in the plan view, the first external electrode 3 is divided into the 1-1 external electrode 31, the 1-2 external electrode 32, the 1-3 external electrode 46 and the 1-4 external electrode 47. Thus, the gap 11 forms a line symmetry shape having two axes of symmetric passing through the center of gravity C of the substrate 2—an axis of symmetry A parallel to the first direction X, and an axis of symmetry B parallel to the second direction Y.

The resistance layer 21 is formed across an entirety of the 1-1 external electrode 31, the 1-2 external electrode 32, the 1-3 external electrode 46 and the 1-4 external electrode 47 to include the center C of the cross-shaped gap 11. That is to say, the resistance layer 21 overlaps a corner 61 of the 1-1 external electrode 31, a corner 62 of the 1-2 external electrode 32, a corner 63 of the 1-3 external electrode 46 and a corner 64 of the 1-4 external electrode in the plan view. Moreover, the corner 61 to the corner 64 are portions of the 1-1 external electrode 31, the 1-2 external electrode 32, the 1-3 external electrode 46 and the 1-4 external electrode 47 opposite to the center C of the cross-shaped gap 61.

[Chip Part 57]

Figure 13:
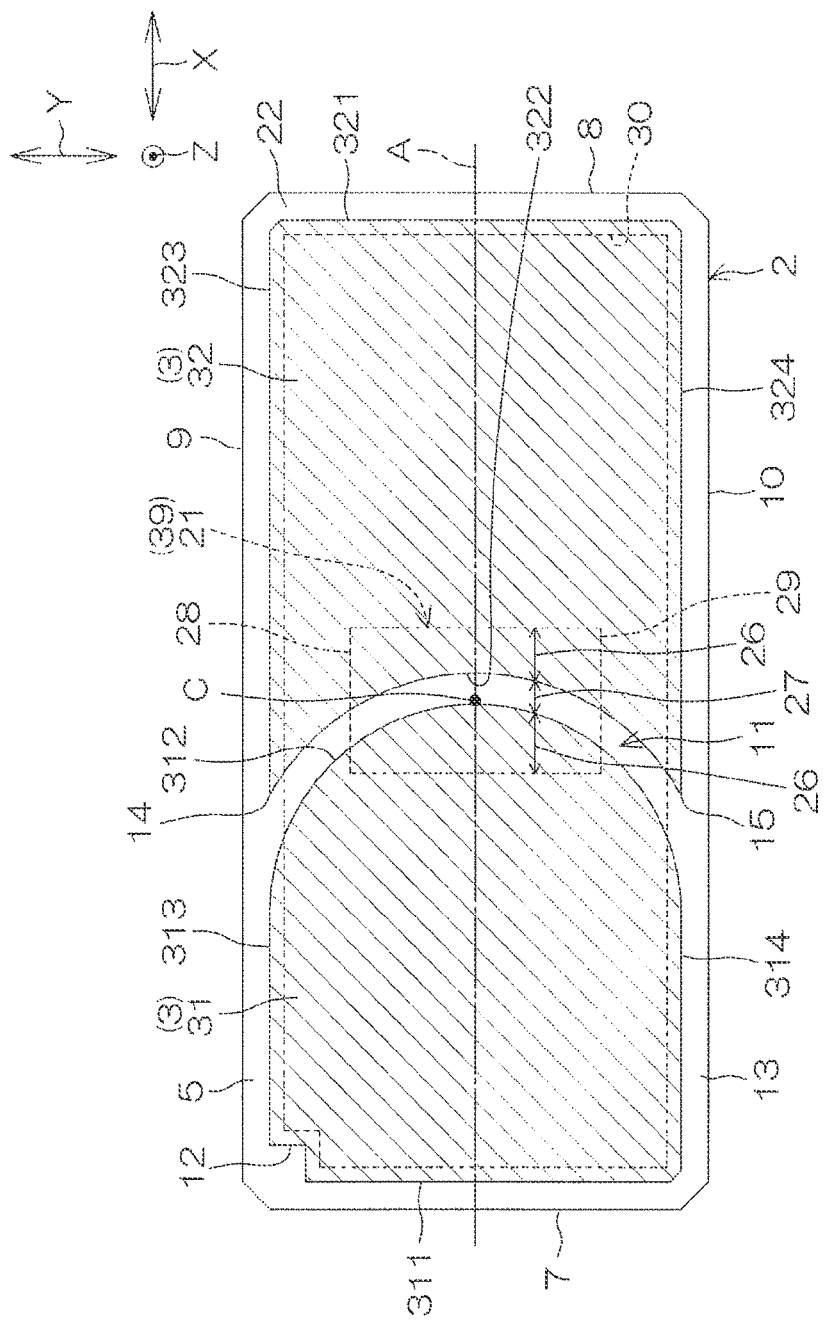
FIG. 13 is a schematic top view of the chip part.

FIG. 13 shows a schematic top view of the chip part 57. The chip part 57 and the chip part 1 are common in that, the gap 11 is symmetrical about the axis of symmetry A, but the gap 11 of the chip part 57 is not a linear shape extending along the second direction Y. More specifically, in the chip part 57, the gap 11 is formed as a semi-circle having diameter ends on the third side surface 9 and the fourth side surface 10 of the substrate 2.

[Chip Part 58]

Figure 14:
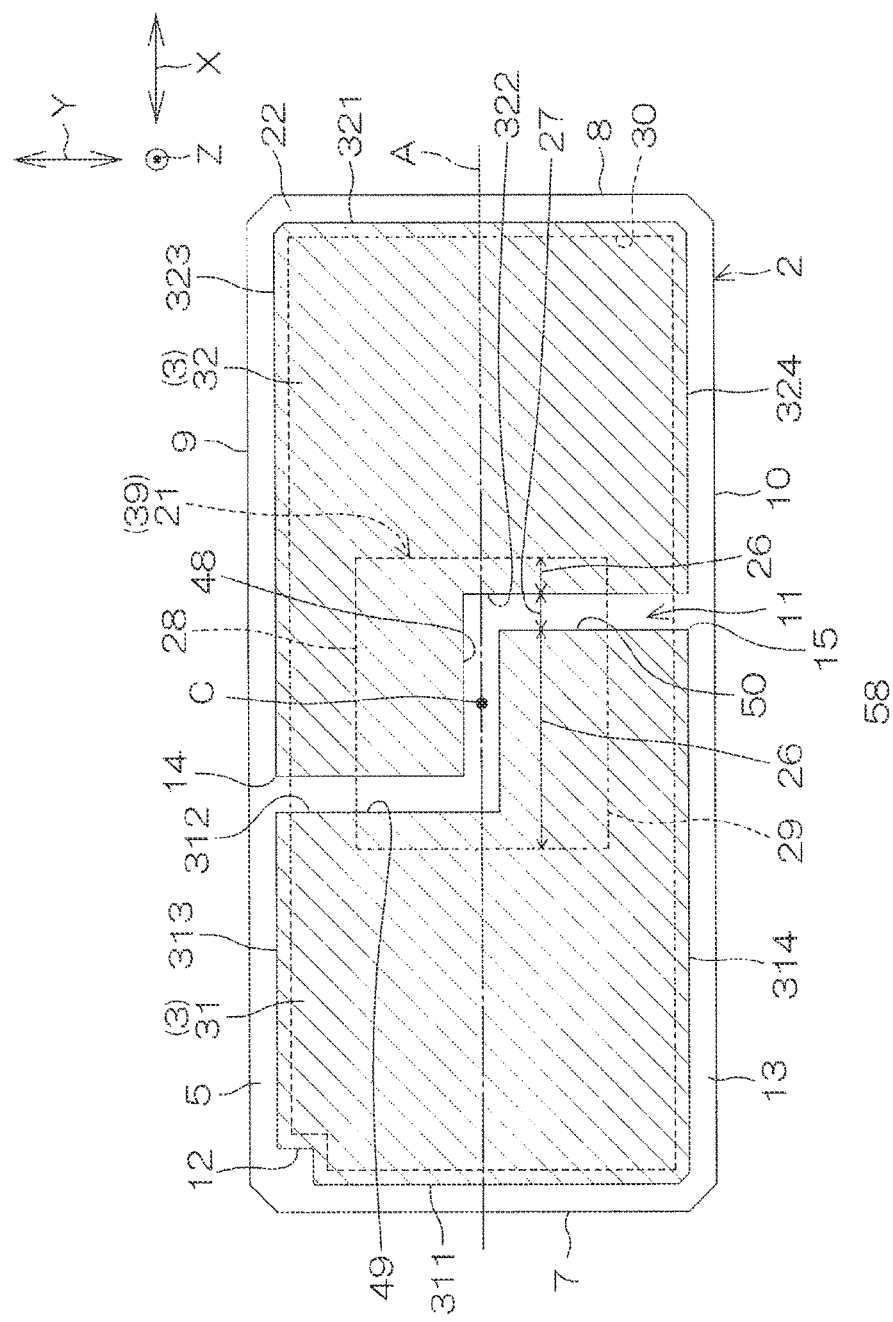
FIG. 14 is a schematic top view of the chip part.

FIG. 14 shows a schematic top view of the chip part 58. The chip part 58 and the chip part 1 are common in that, the gap 11 is symmetrical about the center C of symmetry, but the gap 11 of the chip part 58 is not a linear shape extending along the second direction Y. More specifically, in the chip part 58, the gap 11 is formed as a crank axis shape, which integrally includes: a straight first portion 48 passing through the center C and extending in the first direction X, a straight portion 49 extending in the second direction Y from one end of the first portion 48 (an end on the first side surface 7) toward the third side surface 9 of the substrate 2, and a straight third portion 50 extending in the second direction Y from the other end of the first portion 48 (an end on the second side surface 8) toward the fourth side surface 10 of the substrate 2. If the substrate 2 is rotated 180° about the center C, the second portion 49 is consistent with the third portion 50.

The embodiments of the present disclosure are described above; however, the present disclosure may also be implemented in other configurations.

The embodiments of the present disclosure described above are examples in all aspects and are not to be interpreted in a restrictive manner, but are intended to encompass modifications in all aspects.

The features given in the notes below can be extracted from the detailed description and the drawings of the present application.

[Note 1-1]

A chip part (1, 51 to 58) includes:

a semiconductor substrate (2), having a first main surface (5) and a second main surface (6) opposite to the first main surface (5);

a capacitive film (20), disposed on the first main surface (5);

a plurality of first electrodes (3), disposed on the capacitive film (20) and separated from each other;

a second electrode (4), disposed on the second main surface (6); and a resistance layer (21), disposed between the capacitive film (20) and the plurality of first electrodes (3), and formed across the plurality of first electrodes (3).

According to the configuration, the first electrodes (3) are opposite to the semiconductor substrate (2) (the second electrode (4)) interposed by the capacitive film (20) in between. Thus, a vertical capacitor (33) having a laminated structure of an upper electrode-capacitive film (20)—lower electrode is formed in the longitudinal direction along the thickness direction of the semiconductor substrate (2). On the other hand, the first electrodes (3) include a plurality of first electrodes (3) separated from each other, and the resistance layer (21) is formed across the plurality of first electrodes (3). Thus, the resistance layer (3) is connected in series among the plurality of first electrodes (3) to form a horizontal resistance element (39) in which a current flows in the lateral direction of the first main surface (5) of the semiconductor substrate (2). That is to say, the chip part (1, 51 to 58) according to an embodiment of the present disclosure is a composite element in which the vertical capacitor (33) and the horizontal resistance element (39) are formed on the common semiconductor substrate (2) (the vertical capacitor (33) and the horizontal resistance element (39) are integrated on one semiconductor substrate (2)). Because the first electrodes (3) of the vertical capacitor (33) serve as a terminal of the horizontal resistance element (39), a region for the capacitor (33) and a region for the resistance element (39) can be formed in an overlapping manner on the first main surface (5) of the semiconductor substrate (2). Thus, the space of the first main surface (5) of the semiconductor substrate (2) can be efficiently utilized, thereby providing the chip part (1, 51 to 58) including a small-size composite element.

Moreover, because the plurality of first electrodes (3) are separated from each other, compared to a situation where the plurality of first electrodes (3) are formed as one integral single electrode layer, the stress transferred from the first electrodes (3) to the capacitive film (20) can be reduced. Thus, warping of the semiconductor substrate (2) can be mitigated.

[Note 1-2]

The chip part (1, 51 to 58) according to note 1-1 further includes an adhesion layer (36), disposed between the capacitive film (20) and the plurality of first electrodes (3) to improve adhesion between the plurality of first electrodes (3) and the capacitive film (20).

According to the configuration, the adhesion between the first electrodes (3) and the capacitive film (2) can be improved, thereby preventing the first electrodes (3) from stripping off from the capacitive film (20). Thus, strength reliability of the chip part (1, 51 to 58) can be enhanced.

[Note 1-3]

In the chip part (1, 51 to 58) according to note 1-2, the capacitive film (20) includes a $SiO_2$ film, the plurality of first electrodes (3) include an Au electrode, and the adhesion layer (36) includes a TiW layer.

[Note 1-4]

In the chip part (1, 51 to 58) according to note 1-1, the first electrodes (3) are directly disposed on the capacitive film (20).

[Note 1-5]

In the chip part (1, 51 to 58) according to note 1-4, the capacitive film (20) includes a $SiO_2$ film, the plurality of first electrodes (3) include an Au electrode.

[Note 1-6]

In the chip part (1, 51 to 58) according to any of note 1-2 to note 1-5, the resistance layer (21) includes a TiN layer.

According to the configuration, the resistance value of the resistance layer (21) can be designed to be a lower value.

[Note 1-7]

In the chip part (1, 51 to 58) according to any of note 1-2 to note 1-5, the resistance layer (21) includes a polycrystalline silicon (polysilicon) layer.

According to the configuration, the resistance value of the resistance layer (21) can be designed to be a higher value. Moreover, by adjusting the concentration of impurities included in the polysilicon layer, the resistance value of the resistance layer (21) can be easily adjusted.

[Note 1-8]

In the chip part (1, 51 to 58) according to any of note 1-1 to note 1-7, an exposed region (27) partially exposing the resistance layer (21) is formed between adjacent of the plurality of first electrodes (3), and the chip part (1, 51 to 58) further includes a protective film (37) covering the resistance layer (21) in the exposed region (27).

According to the configuration, the resistance layer (21) is covered by the protective film (37). Thus, for example, during etching after an electrode material such as the plurality of first electrodes (3) are formed on the resistance layer (21), the surface of the resistance layer (21) can be prevented from being exposed to the etching liquid or etching gas. As a result, unintentional cutting and thinning of the resistance layer (21) can be inhibited, thereby enhancing precision reliability of the capacitance value of the capacitor (33).

[Note 1-9]

In the chip part (1, 51 to 58) according to note 1-8, the plurality of first electrodes (3) include an upper surface (38) for connecting with a bonding member and a side surface (312, 322) continuous with the upper surface (38), and a peripheral edge (41) of the upper surface (38) of the plurality of first electrodes (3) forms a boundary with the side surface (312, 322) of the plurality of first electrodes (3) exposed in an upper region of the protective film (37).

According to the configuration, the upper surface (38) of the plurality of first electrodes (3) is exposed at the peripheral edge (41), and hence, for example, a larger bonding space for a bonding component such as a bonding line (42) can be ensured in the upper surface (38) of the plurality of first electrodes (3).

[Note 1-10]

In the chip part (1, 51 to 58) according to any of note 1-1 to note 1-9, a gap (11) is formed between two adjacent first electrodes (3) among the plurality of first electrodes (3), a first end (14) and a second end (15) opposite to the first end (14) of the gap (11) are open and symmetrically positioned, and the resistance layer (21) is arranged substantially in a center between the first end (14) and the second end (15) of the gap (11) in a plan view.

[Note 1-11]

In the chip part (1) according to note 1-10, the semiconductor substrate (2) is in a quadrilateral shape having a pair of first side surfaces (9, 10) facing each other and a pair of second side surfaces (7, 8) facing each other in the plan view, the gap (11) extends from one of the first side surfaces (9) toward the other of the first side surfaces (10) and includes a linear gap (11) extending along the second side surfaces (7, 8), and the resistance layer (21) is spaced from each of the first end (14) and the second end (15) along a longitudinal direction of the linear gap (11) and disposed substantially in a center of the linear gap (11).

[Note 1-12]

In the chip part (1, 51 to 58) according to any of note 1-1 to note 1-9, the semiconductor substrate (2) is in a rectangular shape having a pair of first side surfaces (9, 10) facing to each other and a pair of second side surfaces (7, 8) facing to each other in a plan view, with the first side surfaces (9, 10) being a longitudinal side and the second side surfaces (7, 8) being a lateral side, and the plurality of first electrodes (3) include a plurality of first electrodes (3) divided along a lateral direction of the semiconductor substrate (2) and arranged in a row along a longitudinal direction of the semiconductor substrate (2) in the plan view.

[Note 1-13]

In the chip part (1, 51 to 58) according to any of note 1-1 to note 1-9, the semiconductor substrate (2) is in a rectangular shape having a pair of first side surfaces (9, 10) facing to each other and a pair of second side surfaces (7, 8) facing to each other in a plan view, with the first side surfaces (9, 10) being a longitudinal side and the second side surfaces (7, 8) being a lateral side, and the plurality of first electrodes (3) include a plurality of first electrodes (3) divided along a longitudinal direction of the semiconductor substrate (2) and arranged in a row along a lateral direction of the semiconductor substrate (2) in the plan view.

[Note 1-14]

In the chip part (1) according to note 1-12 or note 1-13, the plurality of first electrodes (3) include two first electrodes (3) independent from each other.

[Note 1-15]

In the chip part (1, 51 to 58) according to any of note 1-12 to note 1-13, the plurality of first electrodes (3) include three or more first electrodes (3) independent from each other.

[Note 1-16]

In the chip part (1, 51 to 58) according to any of note 1-1 to note 1-15, only one resistance layer (21) is formed on the capacitive film (20).

[Note 1-17]

In the chip part (1, 51 to 58) according to any of note 1-1 to note 1-15, a plurality of the resistance layer (21) are formed on the capacitive film (20).

[Note 1-18]

In the chip part (1, 51 to 58) according to any of note 1-1 to note 1-17, the semiconductor substrate (2) has a thickness between 200 micrometers (μm) and 600 μm.

[Note 1-19]

In the chip part (1, 51 to 58) according to any of note 1-1 to note 1-18, the semiconductor substrate (2) includes a silicon (Si) substrate.

[Note 1-20]

In the chip part (1, 51 to 58) according to any of note 1-1 to note 1-19, the capacitive film (20) includes at least one selected from a group including a SiO$_2$ film, SiN film, ON film, ONO film, Al$_2$O$_3$ film and Ti$_3$O$_5$ film.

The invention claimed is:

1. A chip part, comprising:
a semiconductor substrate, having a first main surface and a second main surface opposite to the first main surface;
a capacitive film, disposed on the first main surface;
a plurality of first electrodes, disposed on the capacitive film and separated from each other;
a second electrode, disposed on the second main surface; and
a resistance layer, disposed between the capacitive film and the plurality of first electrodes, and formed across the plurality of first electrodes,
wherein the resistance layer is separated from the plurality of first electrodes,
wherein the resistance layer is horizontally disposed across the plurality of first electrodes and includes an exposed region exposed from a gap between two or more of the plurality of first electrodes and a covered region covered by one of the plurality of first electrodes, and
wherein
the gap is formed between two adjacent first electrodes among the plurality of first electrodes,
a first end and a second end opposite to the first end of the gap are open and symmetrically positioned, and
the resistance layer is arranged substantially in a center between the first end and the second end of the gap in a plan view.

2. The chip part of claim 1, further comprising an adhesion layer, disposed between the capacitive film and the plurality of first electrodes to improve adhesion between the plurality of first electrodes and the capacitive film.

3. The chip part of claim 2, wherein
the capacitive film includes a SiO$_2$ film,
the plurality of first electrodes include an Au electrode, and
the adhesion layer includes a TiW layer.

4. The chip part of claim 2, wherein the resistance layer includes a TiN layer.

5. The chip part of claim 2, wherein the resistance layer includes a polycrystalline silicon (polysilicon) layer.

6. The chip part of claim 1, wherein the plurality of first electrodes are directly formed on the capacitive film.

7. The chip part of claim 6, wherein
the capacitive film includes a SiO$_2$ film, and
the plurality of first electrodes include an Au electrode.

8. The chip part of claim 1, wherein
the chip part further comprises a protective film covering the resistance layer in the exposed region.

9. The chip part of claim 8, wherein
the plurality of first electrodes include an upper surface for connecting with a bonding member and a side surface continuous with the upper surface, and
a peripheral edge of the upper surface of the plurality of first electrodes forms a boundary with the side surface of the plurality of first electrodes exposed in an upper region of the protective film.

10. The chip part of claim 1, wherein
the semiconductor substrate is in a quadrilateral shape having a pair of first side surfaces facing each other and a pair of second side surfaces facing each other in the plan view,
the gap extends from one of the first side surfaces toward another of the first side surfaces and includes a linear gap extending along the second side surfaces,
the resistance layer is spaced from each of the first end and the second end along a longitudinal direction of the linear gap and disposed substantially in a center of the linear gap.

11. The chip part of claim 1, wherein
the semiconductor substrate is in a rectangular shape having a pair of first side surfaces facing to each other and a pair of second side surfaces facing to each other in a plan view, the first side surfaces being longer sides and the second side surfaces being shorter sides, and
the plurality of first electrodes are divided along a lateral direction of the semiconductor substrate and arranged in a row along a longitudinal direction of the semiconductor substrate in the plan view.

12. The chip part of claim 11, wherein the plurality of first electrodes include two first electrodes independent from each other.

13. The chip part of claim 11, wherein the plurality of first electrodes include three or more first electrodes independent from each other.

14. The chip part of claim 1, wherein
the semiconductor substrate is in a rectangular shape having a pair of first side surfaces facing each other and a pair of second side surfaces facing each other in a plan view, the first side surfaces being longer sides and the second side surfaces being shorter sides, and
the plurality of first electrodes are divided along a longitudinal direction of the semiconductor substrate and arranged in a row along a lateral direction of the semiconductor substrate in the plan view.

15. The chip part of claim 1, wherein only one resistance layer is formed on the capacitive film.

16. The chip part of claim 1, wherein a plurality of the resistance layer are formed on the capacitive film.

17. The chip part of claim 1, wherein the semiconductor substrate has a thickness between about 200 micrometers (μm) and about 600 μm.

18. The chip part of claim 1, wherein the semiconductor substrate includes a silicon (Si) substrate.

19. The chip part of claim 1, wherein the capacitive film includes at least one selected from a group including of SiO$_2$ film, SiN film, ON film, ONO film, Al$_2$O$_3$ film and Ti$_3$O$_5$ film.

* * * * *